(12) United States Patent
Weyers et al.

(10) Patent No.: US 10,354,992 B2
(45) Date of Patent: Jul. 16, 2019

(54) SEMICONDUCTOR DEVICES AND METHODS FOR FORMING A SEMICONDUCTOR DEVICE

(71) Applicant: Infineon Technologies Dresden GmbH & Co. KG, Dresden (DE)

(72) Inventors: Joachim Weyers, Hoehenkirchen (DE); Franz Hirler, Isen (DE); Ahmed Mahmoud, Munich (DE); Yann Ruet, Villach (AT); Enrique Vecino Vazquez, Munich (DE)

(73) Assignee: Infineon Technologies Dresden GmbH & Co. KG, Dresden (DE)

( * ) Notice: Subject to any disclaimer, the term of this patent is extended or adjusted under 35 U.S.C. 154(b) by 0 days.

(21) Appl. No.: 15/718,456

(22) Filed: Sep. 28, 2017

(65) Prior Publication Data
US 2018/0090479 A1    Mar. 29, 2018

(30) Foreign Application Priority Data
Sep. 29, 2016  (DE) .................. 10 2016 118 499

(51) Int. Cl.
*H01L 27/02*  (2006.01)
*H01L 27/07*  (2006.01)
(Continued)

(52) U.S. Cl.
CPC ...... *H01L 27/0255* (2013.01); *H01L 27/0727* (2013.01); *H01L 29/0615* (2013.01); *H01L 29/0619* (2013.01); *H01L 29/0638* (2013.01); *H01L 29/0692* (2013.01); *H01L 29/1079* (2013.01); *H01L 29/1095* (2013.01); *H01L 29/36* (2013.01); *H01L 29/408* (2013.01);
(Continued)

(58) Field of Classification Search
None
See application file for complete search history.

(56) References Cited

U.S. PATENT DOCUMENTS 7,511,357 B2  3/2009  Hshieh
2008/0296684 A1  12/2008  Nozu
(Continued)

FOREIGN PATENT DOCUMENTS

DE  202004021424 U1  2/2008
DE  102016104796 A1  9/2017

*Primary Examiner* — Long Pham
(74) *Attorney, Agent, or Firm* — Murphy, Bilak & Homiller, PLLC

(57) ABSTRACT

A semiconductor device includes a transistor arrangement and a diode structure. The diode structure is coupled between a gate electrode structure of the transistor arrangement and a source electrode structure of the transistor arrangement. An insulating layer is located vertically between the diode structure and a front side surface of a semiconductor substrate of the semiconductor device. The diode structure includes at least one diode pn-junction. A substrate pn-junction extends from the front side surface of the semiconductor substrate into the semiconductor substrate between a shielding doping region and an edge doping portion. The edge doping portion is located adjacent to the shielding doping region within the semiconductor substrate. At the front side surface of the semiconductor substrate, the substrate pn-junction is located laterally between the diode pn-junction and a source contact region of the diode structure with the source electrode structure.

20 Claims, 12 Drawing Sheets

(51) Int. Cl.
  *H01L 29/06*     (2006.01)
  *H01L 29/10*     (2006.01)
  *H01L 29/36*     (2006.01)
  *H01L 29/40*     (2006.01)
  *H01L 29/45*     (2006.01)
  *H01L 29/49*     (2006.01)
  *H01L 29/66*     (2006.01)
  *H01L 29/78*     (2006.01)
  *H01L 29/866*    (2006.01)

(52) U.S. Cl.
  CPC .......... *H01L 29/45* (2013.01); *H01L 29/4966* (2013.01); *H01L 29/66106* (2013.01); *H01L 29/7808* (2013.01); *H01L 29/7811* (2013.01); *H01L 29/7821* (2013.01); *H01L 29/7823* (2013.01); *H01L 29/866* (2013.01); *H01L 29/0634* (2013.01); *H01L 29/0696* (2013.01)

(56) References Cited

U.S. PATENT DOCUMENTS

| | | |
|---|---|---|
| 2009/0219657 A1 | 9/2009 | Hshieh |
| 2015/0187874 A1 | 7/2015 | Hirler et al. |
| 2015/0333168 A1 | 11/2015 | Hirler et al. |
| 2016/0064554 A1 | 3/2016 | Schulze et al. |

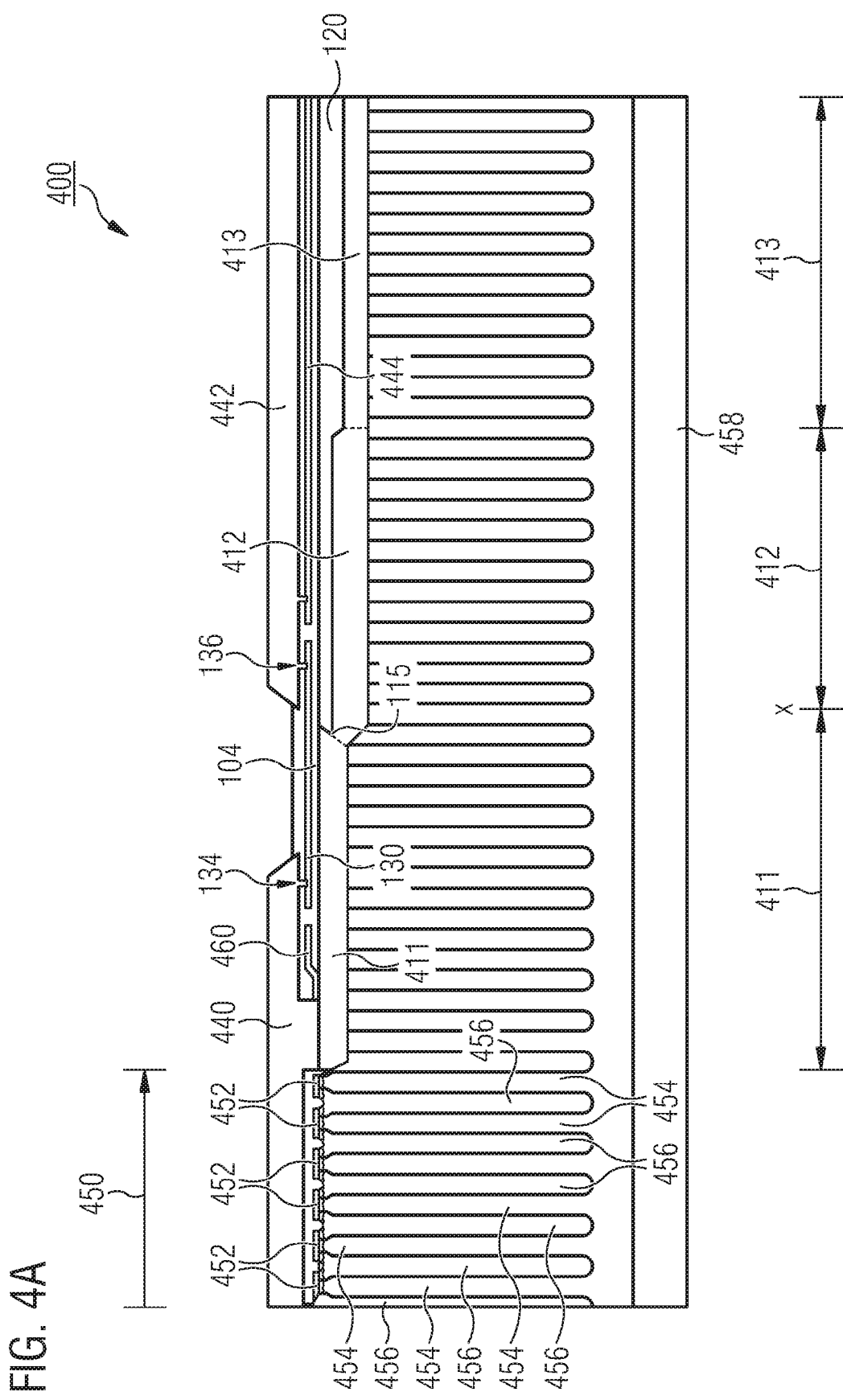

SEMICONDUCTOR DEVICES AND METHODS FOR FORMING A SEMICONDUCTOR DEVICE

TECHNICAL FIELD

Embodiments relate to concepts for an integration of diodes in semiconductor devices and in particular to semiconductor devices and methods for forming semiconductor devices.

BACKGROUND

Semiconductor devices can be subjected to various effects, which may cause damage to the semiconductor devices or even destroy them. For example, semiconductor devices may be subjected to electrostatic discharge or to locally too high current densities, especially during switching or transient events. However, protection methods for semiconductor devices often lead to other drawbacks such as longer switching times of a semiconductor device, more process steps during production of the semiconductor device, and/or an increased power consumption of the semiconductor device. It is desired to protect semiconductor devices from such harmful effects without worsening other performance factors of the semiconductor devices.

SUMMARY

There may be a demand for providing an improved concept for semiconductor devices which provide increased reliability and/or durability.

Some embodiments relate to a semiconductor device comprising a transistor arrangement and a diode structure. The diode structure is coupled between a gate electrode structure of the transistor arrangement and a source electrode structure of the transistor arrangement. An insulating layer is located vertically between the diode structure and a front side surface of a semiconductor substrate of the semiconductor device. The diode structure comprises at least one diode pn-junction. A substrate pn-junction extends from the front side surface of the semiconductor substrate into the semiconductor substrate between a shielding doping region and an edge doping portion. The edge doping portion is located adjacent to the shielding doping region within the semiconductor substrate. The substrate pn-junction is located at the front side surface of the semiconductor substrate laterally between the diode pn-junction and a source contact region of the diode structure with the source electrode structure.

Some embodiments relate to another semiconductor device comprising a transistor arrangement and a diode structure. The diode structure is coupled between a gate electrode structure of the transistor arrangement and a source electrode structure of the transistor arrangement. An insulating layer is located vertically between the diode structure and a front side surface of a semiconductor substrate of the semiconductor device. The diode structure comprises at least one diode pn-junction. A depletion boundary between a non-depletable doping portion of a shielding doping region of the semiconductor substrate and a depletable doping portion of the shielding doping region extends from the front side surface of the semiconductor substrate into the semiconductor substrate during a blocking mode of the transistor arrangement. The non-depletable doping portion comprises a doping non-depletable by voltages applied to the semiconductor device during the blocking mode. The depletable doping portion comprises a doping depletable by voltages applied to the semiconductor device during the blocking mode. The depletion boundary is located at the front side surface of the semiconductor substrate laterally between the diode pn-junction and a source contact region of the diode structure with the source electrode structure.

Some embodiments relate to a method for forming a semiconductor device. The method comprises forming an insulating layer on a front side surface of a semiconductor substrate and forming a diode structure coupled between a gate electrode structure of a transistor arrangement and a source electrode structure of the transistor arrangement. The insulating layer is located vertically between the diode structure and the front side surface of the semiconductor substrate, wherein the diode structure comprises at least one diode pn-junction. Further, a substrate pn-junction extends from the front side surface of the semiconductor substrate into the semiconductor substrate between a shielding doping region and an edge doping portion located adjacent to the shielding doping region within the semiconductor substrate. Additionally, the substrate pn-junction is located at the front side surface of the semiconductor substrate laterally between the diode pn-junction and a source contact region of the diode structure with the source electrode structure.

Some embodiments relate to another method for forming a semiconductor device. The method comprises forming an insulating layer on a front side surface of a semiconductor substrate and forming a diode structure coupled between a gate electrode structure of a transistor arrangement and a source electrode structure of the transistor arrangement. The insulating layer is located vertically between the diode structure and the front side surface of the semiconductor substrate. The diode structure comprises at least one diode pn-junction. Further, a depletion boundary between a non-depletable doping portion of a shielding doping region of the semiconductor substrate and a depletable doping portion of the shielding doping region extends from the front side surface of the semiconductor substrate into the semiconductor substrate during a blocking mode of the transistor arrangement. The non-depletable doping portion comprises a doping non-depletable by voltages applied to the semiconductor device during the blocking mode, wherein the depletable doping portion comprises a doping depletable by voltages applied to the semiconductor device during the blocking mode. Additionally, the depletion boundary is located at the front side surface of the semiconductor substrate laterally between the diode pn-junction and a source contact region of the diode structure with the source electrode structure.

BRIEF DESCRIPTION OF THE FIGURES

Some examples of apparatuses and/or methods will be described in the following by way of example only, and with reference to the accompanying figures, in which:

FIG. 4A shows a schematic cross section of a part of a semiconductor device comprising a field effect transistor arrangement;

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
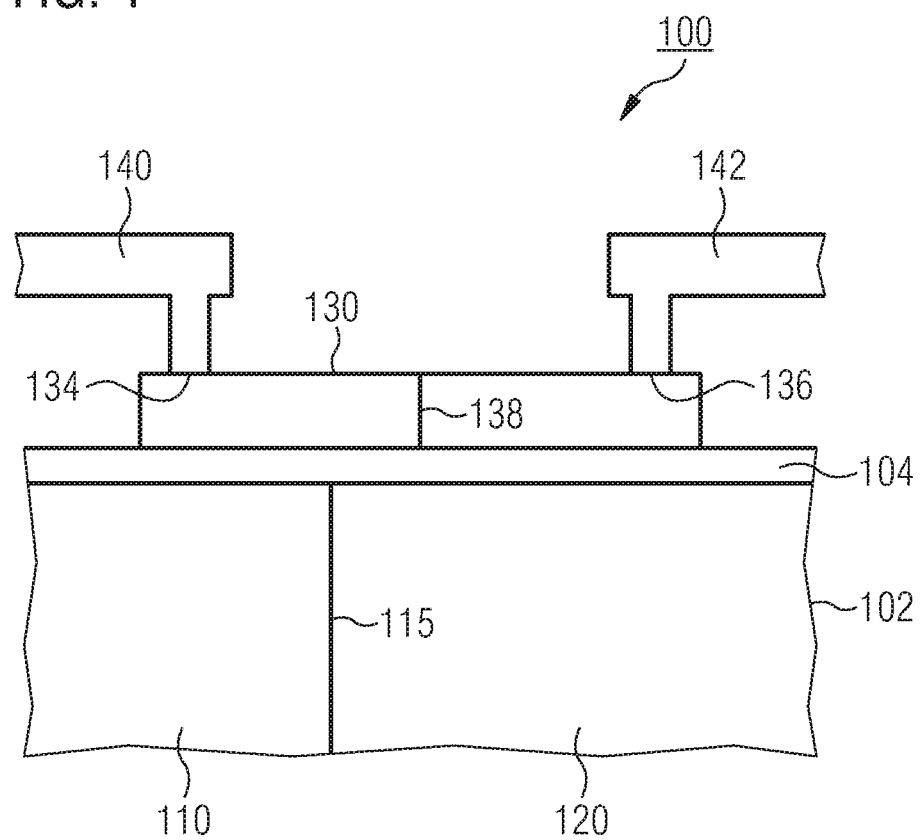
FIG. 1 shows a schematic cross section of a part of a semiconductor device.

FIG. 1 shows a schematic cross section of a part of a semiconductor device 100. The semiconductor device 100 comprises a transistor arrangement and a diode structure 130. The diode structure 130 is coupled between a gate electrode structure 142 of the transistor arrangement and a source electrode structure 140 of the transistor arrangement. An (electrically) insulating layer 104 is located vertically between the diode structure 130 and a front side surface of a semiconductor substrate 102 of the semiconductor device 100. The diode structure 130 comprises at least one diode pn-junction 138. A substrate pn-junction 115 extends from the front side surface of the semiconductor substrate 102 into the semiconductor substrate 102 between a shielding doping region 110 and an edge doping portion 120. The edge doping portion 120 is located adjacent to the shielding doping region 110 within the semiconductor substrate 102. The substrate pn-junction 115 is located at the front side surface of the semiconductor substrate 102 laterally between the diode pn-junction 138 and a source contact region 134 of the diode structure 130 with the source electrode structure 140.

The diode structure 130 coupled between the gate electrode structure 142 of the transistor arrangement of the semiconductor device 100 and the source electrode structure 140 of the transistor arrangement may protect the semiconductor device 100 against electrostatic discharges. To avoid or to reduce an interaction of electric potentials of the semiconductor substrate 102 with the diode structure 130, the diode structure 130 is insulated from the semiconductor substrate 102 by the insulating layer 104 located between the diode structure 130 and the front side surface of the semiconductor substrate 102.

To further avoid or to reduce the interaction of electric potentials of the semiconductor substrate 102 with the diode structure 130, the shielding doping region 110 of the semiconductor substrate 102 is located vertically below a part of the diode structure 130 at the front side surface of the semiconductor substrate 102. Shielding the diode structure 130 by the shielding doping region 110 may reduce a leakage current or a backgate effect of the diode structure 130 during operating the semiconductor device 100. For example, shielding the diode structure from electric potentials of the semiconductor substrate 102 may prevent (or reduce) an undesired channel through the diode structure 130 and/or a turn-on of a parasitic transistor structure comprising the diode structure 130 (e.g., comprising a n-p-n-doping portions sequence or a p-n-p doping portions sequence of the diode structure 130).

This may reduce the power consumption and diode degradation of the semiconductor device 100. In addition to shielding the diode structure 130, the shielding doping region 110 may promote the removal of residual minority charge carriers within the semiconductor device 100 during a switching operation (e.g., turning off or commutating) of the transistor arrangement.

The enhanced removal of residual minority charge carriers due to the shielding doping region 110 may reduce the switching time of the transistor arrangement and may decrease a maximal current density during the removal of the residual minority charge carriers. Additionally, an emitter effect of the shielding doping region 110 for minority charge carriers during commutation may be reduced, since the shielding doping region 110 extends laterally not along the whole diode structure.

For example, a maximal current density during the removal of the residual minority charge carriers may occur at an edge region of the semiconductor substrate 102 (e.g., at the edge doping portion 120 and/or laterally between a cell region of the transistor arrangement and an edge of the semiconductor substrate 102) and may be reduced due to the shielding doping region 110. For example, the shielding doping region is electrically connected to the source electrode structure. Consequently, minority charge carriers present at the edge region of the semiconductor substrate may be discharged via the shielding doping region 110 at the source electrode structure 140 instead of flowing through a body region of the transistor arrangement to the source electrode structure, for example.

To reduce the injection of minority charge carriers from the shielding doping region 110 into other doping regions of the semiconductor substrate (e.g., into the edge doping portion 120), the total lateral extension of the shielding doping region 110 may be shortened. For example, the shielding doping portion extends in laterally direction at the front side surface of the semiconductor substrate 102 vertically below a part of the diode structure, instead of extending vertically below the entire diode structure 130. The substrate pn-junction 115 is located at the front side surface of the semiconductor substrate 102 laterally between the diode pn-junction 138 and the source contact region 134 of the diode structure 130. For example, the substrate pn-junction 115 comprises a part that is located at the front side surface of the semiconductor substrate 102 and that is located laterally between the diode pn-junction 138 and the source contact region 134 of the diode structure 130.

By protecting the semiconductor device 100 against electro static discharges and by reducing the maximal current density occurring during switching operations of the transistor arrangement in the described manner, the reliability and/or durability of the semiconductor device 100 may be increased while maintaining (or reducing) the power consumption of the semiconductor device 100, for example.

The diode pn-junction 138 is located laterally between the source contact region 134 of the diode structure 130 and a gate contact region 136 of the diode structure 130 with the gate electrode structure 142. The shielding doping region 110 may extend laterally (at the front side surface of the semiconductor substrate 102) at least from the substrate pn-junction 115 at the front side surface of the semiconductor substrate 102 to the source contact region 134 of the diode structure 130.

For example, the shielding doping region 110 may extend laterally along the front side surface of the semiconductor substrate 102 from the substrate pn-junction 115 to underneath the source contact region 134 of the diode structure 130, or may further extend laterally to a lateral end of the diode structure 130 located at the source contact region 134 of the diode structure 130.

Additionally, the shielding doping region 110 may extend (laterally) to a body region of the transistor arrangement and/or be electrically connected to the body region via an ohmic path. For example, the shielding doping region 110 comprises the same conductivity type as the body region of the transistor arrangement. This may decrease the maximal current density of the semiconductor device 100 during commutating a drain-source current of the transistor arrangement (e.g. a MOSFET) or a collector-emitter current of the transistor arrangement (e.g. IGBT). For example, the shielding doping region 110 may be part of a junction termination extension (JTE). During a commutation, the gate-source-voltage Vgs may be zero (e.g. the MOS, which works as free-wheeling diode, has Vgs=0V).

The diode structure 130 may comprise at least one (e.g., a first) diode doping region of the first conductivity type located laterally between the diode pn-junction 138 and the source contact region 134 of the diode structure 130. For example, the diode doping region is of the first conductivity type and the shielding doping region 110 may comprise the same conductivity type.

The edge doping portion 120 may comprise a second conductivity type. The edge doping portion 120 may extend laterally at the front side surface of the semiconductor substrate 102 at least from the substrate pn-junction 115 at the front side surface of the semiconductor substrate 102 to (underneath) the gate contact region 136 of the diode structure 130. In this way, the edge doping portion 120 may extend in lateral direction vertically below the diode pn-junction 138 along the front side surface of the semiconductor substrate 102. For example, a shortest lateral distance between the substrate pn-junction 115 and the source contact region 134 of the diode structure 130 may be shorter (e.g., at least 500 nm shorter, or at least 1 μm shorter, or at least 5 μm shorter, or at least 10 μm shorter) than a shortest lateral distance from the diode pn-junction 138 to the source contact region 134 of the diode structure 130.

For example, the edge doping portion 120 extends (vertically) below the diode structure 130 in lateral direction at the front side surface of the semiconductor substrate 102 for at least 20% (or at least 30%, or at least 50%) and/or for at most 90% (or at most 70%, or at most 50%, or at most 40%) of a minimal lateral distance between the gate contact region 136 of the diode structure 130 and the source contact region 134 of the diode structure 130.

The diode structure 130 may comprise additional diode doping regions of the first conductivity types. For example, the diode structure 130 comprises a first diode doping region of the first conductivity type and a second diode doping region of the first conductivity type. The first diode doping region of the first conductivity type may be located laterally between the diode pn-junction 138 and the source contact region 134 of the diode structure 130. The second diode doping region of the first conductivity type may be located laterally between the diode pn-junction 138 and the gate contact region 136 of the diode structure 130.

The edge doping portion 120 may extend laterally underneath the second diode doping region of the first conductivity type. For example, at the front side surface of the semiconductor substrate 102, the edge doping portion 120 may extend laterally underneath the second diode doping region of the first conductivity type.

For example, the diode structure 130 may comprise at least one diode doping region of the second conductivity type. The diode doping region of the second conductivity type may comprise the second conductivity type and may be laterally located between the first diode doping region of the first conductivity type and the second diode doping region of the first conductivity type. For example, the diode structure 130 may comprise at least a first diode pn-junction and a second diode pn-junction. The first diode pn-junction may be located laterally between the second diode pn-junction and the source contact region 134 of the diode structure 130. At the front side surface of the semiconductor substrate 102, the substrate pn-junction 115 may be located laterally between the second diode pn-junction and the source contact region 134 of the diode structure 130.

For example, the substrate pn-junction 115 may be located laterally between the first and the second diode pn-junction at the front side surface of the semiconductor substrate 102. Thus, at the front side surface of the semiconductor substrate 102, the shielding doping region 110 may be located vertically below the first diode doping region of the first conductivity type, the first diode pn-junction, and a part of the diode doping region of the second conductivity type laterally adjacent to the first diode pn-junction. At the front side surface of the semiconductor substrate 102, the edge doping portion 120 may then be located vertically below a part of the diode doping region of the second conductivity type laterally adjacent to the second diode pn-junction, the second diode pn-junction, and the second diode doping region of the first conductivity type. For example, the edge doping portion may be at least partially located vertically below the second diode doping region of the first conductivity type.

For example, the diode structure may comprise a plurality of diode doping regions of first and second conductivity type arranged alternatingly between the source contact region and the gate contact region of the diode structure. The diode structure may be implemented in or by a single electrically conductive layer (e.g. polysilicon layer) comprising regions of different conductivity type. The electrically conductive layer of the diode structure may be a lowermost electrically conductive layer of a wiring layer stack of the semiconductor device 100 located at the front side surface of the semiconductor substrate 102.

The first and the second diode doping region of the first conductivity type together with the diode doping region of the second conductivity type can form an n-p-n-doping portions sequence or a p-n-p doping portions sequence of the diode structure. In this way, the diode structure may provide an electro static discharge protection of the semiconductor device 100 while blocking currents in both directions through the diode structure as long as a gate-source voltage of the transistor arrangement does not exceed the breakdown voltage of the diode structure.

The n-p-n-doping portions sequence (or p-n-p doping portions sequence) may however form a parasitic transistor structure (e.g., a parasitic field-effect transistor structure) together with the semiconductor substrate 102. For example, the diode doping region of the second conductivity type of the diode structure 130 may represent a body region of the parasitic field-effect transistor structure, while one of the diode doping region of the first conductivity types may represent a source region and the other diode doping region of the first conductivity type may represent a drain region of the parasitic field-effect transistor structure. The insulating layer 104 may represent a gate insulation and the semiconductor substrate 102 may represent the gate of the parasitic field-effect transistor structure. To avoid a turn-on of this parasitic field-effect transistor structure and hence to avoid an increase in leakage current (or to reduce leakage current) through the diode structure 130, a threshold voltage (e.g., the absolute value of the threshold voltage) of the parasitic field-effect transistor structure may be increased by increasing a thickness of the insulating layer 104. For example, a thickness of the insulating layer 104 may be larger than 300 nm (or larger than 500 nm, or larger than 1000 nm) and/or smaller than 3000 nm (or smaller than 2000 nm, or smaller than 1000 nm).

To avoid a turn-on of the parasitic field-effect transistor structure, the absolute value of a voltage between the diode structure 130 and any point on the front side surface of the semiconductor substrate 102 located laterally between the source contact region 134 of the diode structure 130 and the gate contact region 136 of the diode structure 130 (e.g. in a top view of the semiconductor device) may be maintained below the absolute value of the threshold voltage of the parasitic transistor structure in any normal operating mode (e.g., forward mode, reverse mode, and/or blocking mode) of the transistor arrangement.

For example, the substrate pn-junction 115 may be located at the front side surface of the semiconductor substrate 102 at a position laterally between the diode pn-junction 138 and the source contact region 134 of the diode structure 130, so that, during applying a maximal operating voltage in a blocking mode (e.g., in an off-state) of the transistor arrangement, the absolute value of a voltage between the diode structure 130 and any point on the front side surface of the semiconductor substrate 102 located laterally between the source contact region 134 of the diode structure 130 and the gate contact region 136 of the diode structure 130 is smaller than the absolute value of the threshold voltage of the parasitic transistor structure. The parasitic transistor structure may comprise at least one n-p-n-doping portions sequence of the diode structure 130 or at least one p-n-p doping portions sequence of the diode structure 130.

The blocking mode and/or the commutation mode may be one of several operation modes during normal operation of the semiconductor device 100. For example, voltages above the breakdown voltage or maximal blocking voltage specified for the semiconductor device 100 (e.g. defined in the data sheet of the semiconductor device) do not occur during normal operation of the semiconductor device 100. For example, the normal operation may include commutating the semiconductor device 100 and/or switching the vertical electrical element arrangement from an on-state to an off-state and vice versa. For example, the semiconductor device 100 is commutated by changing from a forward mode to a reverse mode (e.g. changing the drain-source voltage Vds from a positive to a negative voltage or vice versa). In the forward mode, the semiconductor device may be in an on-state or off-state (blocking state) depending on the applied gate-source voltage Vgs.

In the blocking mode of the transistor arrangement a current (e.g., a drain-source current or a collector-emitter current) flowing through transistor arrangement may be essentially equal to zero (e.g., neglecting leakage currents through the transistor arrangement). For example, if the transistor arrangement is an enhancement mode n-channel field-effect transistor, a drain-source voltage of the transistor arrangement may be positive (e.g. NMOS comprises a positive Vds in blocking mode) and the gate-source voltage of the transistor arrangement may be smaller than a threshold voltage of the transistor arrangement (or may be essentially equal to zero, or may be smaller than zero). A maximal operating voltage in the blocking mode may correspond to a drain-source voltage (or collector-emitter voltage) that biases the transistor arrangement to the verge of an avalanche state (or breakdown-state). For example, an absolute value of the maximal operating voltage in the blocking mode may be slightly less than the breakdown voltage of the transistor arrangement (e.g., may be larger than 95% of the breakdown voltage and smaller than the breakdown voltage), while the gate-source voltage of the transistor arrangement may be essentially zero. Alternatively, the maximal operating voltage in the blocking mode may be defined as being (essentially) equal to the breakdown voltage of the transistor arrangement.

The blocking mode of the transistor arrangement of the semiconductor device 100 with the operating voltage set to maximum (e.g., the absolute value of the operating voltage set to maximum) may correspond to a worst-case scenario for a turn-on of the parasitic transistor structure. If the absolute value of a voltage between the diode structure 130 and any point on the front side surface of the semiconductor substrate 102 (located laterally between the source contact region 134 of the diode structure 130 and the gate contact region 136 of the diode structure 130) can be maintained below the absolute value of the threshold voltage of the parasitic transistor structure, the parasitic transistor structure may also be prevented from turning on (e.g., from forming a conducting channel) during any other operating mode (e.g., a forward, reverse or blocking mode) of the transistor arrangement of the semiconductor device 100.

For example, the substrate pn-junction 115 is located at the front side surface of the semiconductor substrate 102 at a position laterally between the diode pn-junction 138 and the source contact region 134 of the diode structure 130, so that, during applying the maximal operating voltage in the blocking mode of the transistor arrangement, the absolute value of a voltage between the diode structure 130 and any point on the front side surface of the semiconductor substrate 102 located laterally between the source contact region 134 of the diode structure 130 and the gate contact region 136 of the diode structure 130 is smaller than 30 V (or smaller than 20 V, or smaller than 10 V, or smaller than 5 V, or equal to zero).

The edge doping portion 120 may extend laterally at the front side surface of the semiconductor substrate 102 at least from the substrate pn-junction 115 at the front side surface of the semiconductor substrate 102 to (underneath) a gate contact region 136 of the diode structure 130. Additionally, the edge doping portion 120 (e.g., at least a part of the edge doping portion 120) may extend laterally at the front side surface of the semiconductor substrate 102 at least (vertically) below an electrically conductive structure. The electrically conductive structure may be part of the gate electrode structure 142 and may be laterally located between the diode structure 130 and an edge of the semiconductor substrate 102.

The electrically conductive structure may be a gate pad of the gate electrode structure or may be a field plate implemented by a lowest electrically conductive layer located above the front side surface of the semiconductor substrate 102. The diode structure 130 may be implemented by the same (e.g., the lowest) electrically conductive layer as the field plate and may be laterally separated from the field plate by insulating material. For example, polysilicon comprised by the diode structure 130 and polysilicon comprised by the field plate may be formed during the same manufacturing step.

Together with the shielding doping region 110 and the edge doping portion 120, the electrically conductive structure may reduce an absolute value of a voltage between the diode structure 130 and any point on the front side surface of the semiconductor substrate 102 located laterally between the source contact region 134 of the diode structure and the gate contact region 136 of the diode structure 130.

The shielding doping region 110 may comprise a position of a maximal doping region located laterally closer to the source contact region of the diode structure 130 than to the diode pn-junction 138. The shielding doping region 110 may comprise a lateral profile of the doping concentration of the shielding doping region comprising a plurality of local maxima and local minima laterally between the substrate pn-junction and a cell region of the transistor arrangement. For example, neighboring local maxima and local minima of the plurality of local maxima and local minima differ by more than 10% (or more than 50%, more than 100%, more than 200% or up to a decade) of the maximal doping concentration. For example, a lateral profile of the doping concentration of the shielding doping region 110 may be on average decreasing from the area comprising the maximal doping concentration of the shielding doping region 110 to the area comprising a lowest doping lower doping concentration at the substrate pn-junction. For example, the shielding doping region 110 may comprise an average doping concentration at a corner region of a cell region of the transistor arrangement being larger (e.g. more than 10% or more than 30% of the average doping concentration at the corner region) than an average doping concentration at an edge of the cell region extending substantially in parallel to an edge of the semiconductor substrate for more than 200 µm (or more than 500 µm). For example, the maximal doping concentration of the shielding doping region 110 does not refer to the doping concentration of a portion of the shielding doping region 110 located directly at an electrical contact (e.g., a metal contact) with the shielding doping region (for example, a vertical wiring element of the source electrode structure used for electrically contacting the shielding doping region 110). This portion of the shielding doping region 110 may generally have the highest doping concentration of the shielding doping region 110 in order to avoid the formation of a parasitic Schottky diode at the contact region between the shielding doping region and the source electrode structure. For example, a minimal lateral distance between any electrical contact region (of a wiring structure of a wiring layer stack located above the front side surface of the semiconductor substrate 102) with the shielding doping region 110 and the area of the shielding doping region 110 comprising the maximal doping concentration may be at least 1 µm (or at least 2 µm, or at least 5 µm).

Because the shielding doping region 110 comprises the area of a maximal doping concentration and the area of the lower doping concentration, a doping profile of the shielding doping region 110 may comprise a gradient of an average doping concentration in lateral direction along the shielding doping region. In this way, an optimal or suitable doping of the shielding doping region 110 may be provided for a large current range of the transistor arrangement caused by the fast varying conditions during commutation due to the lateral variation of the doping of the shielding doping region 110. This may enhance the discharge of minority charge carriers stored in the edge region (or edge doping portion 120) of the semiconductor substrate during commutation.

For example, the shielding doping region may comprise a non-depletable doping portion. The non-depletable doping portion may comprise a doping non-depletable by voltages applied to the transistor arrangement during the blocking mode of the transistor arrangement (e.g., a maximal operating voltage during the blocking mode causing the transistor arrangement to be biased at the verge of an avalanche breakdown). The non-depletable doping portion may extend laterally at the front side surface of the semiconductor substrate from a cell region of the transistor arrangement to a distance to the substrate pn-junction of less than 500 nm (or less than 300 nm or less than 100 nm). For example, it may be sufficient that the non-depletable doping portion is located below a small part of the whole diode structure only (e.g. 500 nm), if this is sufficient due to field plate shielding (e.g. combination of non-depletable doping portion, depletable doping portion, Zener Poly, Gate Poly and/or metal 1 field plate) to limit the course of the electrical potential below the Z-diode at less than 20V.

For example, the non-depletable doping portion may comprise the area of a maximal doping concentration and the area of the lower doping concentration of the shielding doping region 110, as described above. For example, the area with the lower doping concentration may be still non-depletable.

The non-depletable doping portion may comprises an incorporated doping dose of at least $5*10^{11}$ cm$^{-2}$ (or more than $1*10$ cm$^{12}$ cm$^{-2}$, or more than $2*10^{12}$ cm$^{-2}$, or more than $5*10^{12}$ cm$^{-2}$). For example, the non-depletable doping portion may comprise a maximal doping concentration of at least $4*10^{15}$ cm$^{-3}$ (or at least $8*10^{15}$ cm$^{-3}$, or at least $5*10^{16}$ cm$^{-3}$, or at least $1*10^{17}$ cm$^{-3}$, for example $8*10^{15}$ to $1*10^{17}$ cm$^{-3}$).

Optionally, the shielding doping region 110 may comprise a buried portion located vertically below the edge doping portion 120. The buried portion may be vertically adjacent to the edge doping portion 120 and may extend laterally at least from the position of the substrate pn-junction 115 at the front side surface of the semiconductor substrate 102 vertically below a part of the edge doping portion 120 towards an edge of the semiconductor substrate 102. For example, the buried portion may extend laterally from the substrate pn-junction 115 at the front side surface of the semiconductor substrate 102 to at least (underneath) the gate contact region 136 of the diode structure 130.

The buried portion of the shielding doping region 110 may reduce the absolute value of a voltage between the diode structure 130 and any point on the front side surface of the semiconductor substrate 102 located laterally between the source contact region 134 of the diode structure 130 and the gate contact region 136 of the diode structure 130. In addition, the buried portion may promote the discharge of minority charge carriers stored in the edge region (e.g., the edge doping portion 120) of the semiconductor substrate 102 during commutating a current of the transistor arrangement and/or may connect edge termination compensation regions (e.g. superjunction columns) to the source electrode structure.

A maximal vertical extension of the edge doping portion 120 between the front side surface of the semiconductor substrate 102 and the buried portion of the shielding doping region 110 may be smaller than 10 μm (or smaller than 5 μm, or smaller than 2 μm) and/or may be at least 1 μm (or at least 3 μm, or at least 5 μm).

The shielding doping region 110 may extend laterally at least from the source contact region 134 of the diode structure 130 to (underneath) a gate runner of the transistor arrangement and/or to (underneath) a gate pad of the transistor arrangement. For example, the substrate pn-junction 115 may be located at the front side surface of the semiconductor substrate 102 vertically below the gate runner and/or vertically below the gate pad. Alternatively, at least a share of the buried portion of the shielding doping region 110 may be located vertically below the gate runner and/or vertically below the gate pad. This arrangement of the shielding doping region 110 extending laterally at least from the source contact region 134 of the diode structure 130 to (underneath) the gate runner and/or the gate pad may further reduce the interaction of electric potentials of the semiconductor substrate 102 with the diode structure 130. For example, the gate runner and/or the gate pad may serve as a field plate for reducing the absolute value of an electric potential at a part of the front side surface of the semiconductor substrate located vertically below the diode structure 130. The gate pad may provide a connection to electric devices external to the semiconductor device 100. The gate pad may be located at an uppermost metallization of the gate electrode structure 142 (e.g., at an uppermost metallization of a wiring layer stack of the semiconductor device 100). The gate pad may be located laterally between the cell region of the transistor arrangement and an edge of the semiconductor substrate 102. Additionally, at least a portion of the diode structure 130 may be located laterally between an uppermost metallization of the source electrode structure 140 and the uppermost metallization of the gate electrode structure 142. Optionally, a gate resistor structure may be implemented below the gate pad.

The gate runner may be part of the gate electrode structure and may laterally surround the cell region of the transistor arrangement. The gate runner may serve as an electrical connection to gate electrodes (or gates) of the transistor arrangement.

Optionally, the buried portion of the shielding doping region 110 may comprise at least a part (e.g. a part or the whole buried portion) with a doping depletable during applying the maximal operating voltage to the transistor arrangement in the blocking mode (or off-state) of the transistor arrangement. In this way, the buried portion may comprise a doping concentration lower than a minimal doping concentration of a non-depletable doping portion of the shielding doping region 110. A lower doping concentration of the buried portion may reduce the injection of minority charge carriers from the buried portion into adjacent doping portions of the semiconductor substrate 102 (e.g., into the edge doping portion 120 and/or into a drift doping portion of the transistor arrangement).

For example, a maximal doping concentration of the buried portion of the shielding doping region 110 is at most 50% (or at most 40%, or at most 10%, or at most 1%, or at most 0.5%) of the maximal doping concentration of the shielding doping region 110.

For example, the buried portion of the shielding doping region 110 comprises a maximal doping concentration of at most $8*10^{15}$ cm$^{-3}$ (or of at most $4*10^{15}$ cm$^{-3}$, or of at most $1*10^{15}$ cm$^{-3}$) and/or of at least $4*10^{14}$ cm$^{-3}$ (or of at least $2*10^{15}$ cm$^{-3}$, or of at least $6*10^{15}$ cm$^{-3}$). The buried portion of the shielding doping region may comprise an incorporated doping dose of at most $5*10^{12}$ cm$^{-2}$ (or of at most $2*10^{12}$ cm$^{-2}$, or of at most $1*10^{12}$ cm$^{-2}$, or of at most $5*10^{11}$ cm$^{-2}$) and/or of at least $1*10^{10}$ cm$^{-2}$ (or of at least $1*10^{11}$ cm$^{-2}$, or of at least $5*10^{11}$ cm$^{-2}$).

Optionally, the buried portion of the shielding doping region comprises a first part and a second part. The first part of the buried portion may located laterally between the second part of the buried portion and a portion of the shielding doping region located at the front side surface of the semiconductor substrate (e.g., the first part of the buried portion may extend laterally to the position of the substrate pn-junction at the front side surface of the semiconductor substrate 102). The first part of the buried portion may comprise an incorporated doping dose at least twice an incorporated doping dose of the second part of the buried portion.

For example, the first part of the buried portion may extend laterally between 5 μm to 100 μm, while a maximal doping concentration of the first part may essentially remain constant over the lateral extension of the first part. Similarly, the second part of the buried portion may extend laterally between 5 μm to 100 μm from the first part of the buried portion towards an edge of the semiconductor substrate 102, while a maximal doping concentration of the second part may essentially remain constant over the lateral extension of the second part, but may be lower than the maximum doping concentration of the first part. For example, the maximal doping concentration of the first part of the buried portion may be less than $8*10^{15}$ cm$^{-3}$ and/or may be larger than $1*10^{15}$ cm$^{-3}$ (e.g. $3\text{-}4*10^{15}$ cm$^{-3}$). The maximal doping concentration of the second part of the buried portion may be less than $4*10^{15}$ cm$^{-3}$ and/or may be larger than $4*10^{14}$ cm$^{-3}$ (e.g. $5\text{-}6*10^{14}$ cm$^{-3}$), for example.

By reducing the maximum doping concentration of the buried portion towards the edge of the semiconductor substrate 102, the total amount of minority charge carriers injected from the buried portion into adjacent doping portions of the semiconductor substrate 102 (e.g., into the edge doping portion 120 and/or into a drift region of the transistor arrangement) may be reduced, while the buried portion may still provide a sufficient shielding of the diode structure 130 against electric potentials of the semiconductor substrate 102.

For example, the edge doping portion and a drift region of the transistor arrangement may be part of a common (mutual) doping region within the semiconductor substrate 102. In other words, the common doping region of the semiconductor substrate 102 may comprise the edge doping portion 120 and a drift region of the transistor arrangement. For example, the edge doping portion 120 and the drift region may comprise the second conductivity type (e.g. n-doping) and an ohmic path exists between the edge doping portion 120 and the drift region within the semiconductor substrate 102.

The edge doping portion 120 may extend laterally from the substrate pn-junction 115 towards an edge of the semiconductor substrate. For example, the edge doping portion 120 is located outside a cell region of the transistor arrangement. The shielding doping region 110 may extend laterally at the front side surface of the semiconductor substrate from (e.g. an edge of or a doping region of) the cell region of the transistor arrangement at least to the substrate pn-junction 115. For example, the shielding doping region 120 extends vertically below the diode structure 130 in lateral direction at the front side surface of the semiconductor substrate 102 for at least 10 μm (or at least 20 μm, or at least 35 μm) and/or for at most 200 μm (or at most 100 μm, or at most 60 μm, or at most 25 μm).

For example, the shielding doping region may laterally surround the cell region of the transistor arrangement. This may promote the discharging of minority charge carriers stored in the edge region of the semiconductor substrate 102 (e.g., in the edge doping portion 120) anywhere around the cell region during commutating a current of the transistor arrangement. In this way, the shielding doping region 110 may have a combined effect of shielding the diode structure 130 against electric potentials at the semiconductor substrate 102 and of reducing a maximal current density occurring during switching operations of the transistor arrangement.

A maximal depth of the shielding doping region may be equal to or larger than a maximal depth of a body region of the transistor arrangement. For example, edge compensation regions may extend from the shielding doping region vertically into the semiconductor substrate 102. The edge compensation regions may serve a lateral voltage dissipation from the edge of the semiconductor substrate 102 towards the cell region. The edge compensation regions extending from the shielding doping region vertically into the semiconductor substrate 102 may additionally promote the discharge of minority charge carriers stored in the edge region of the semiconductor substrate 102 during commutating a current of the transistor arrangement.

The source electrode structure (or source wiring structure) and the gate electrode structure (or gate wiring structure) may be arranged in a wiring layer stack of the semiconductor device 100. The wiring layer stack is located on the front side surface of the semiconductor substrate 102. The source electrode structure and/or the gate electrode structure may comprise lateral wiring elements (e.g., conductor lines and or conductive planes), vertical wiring elements (e.g., vias), and/or contact pads or contact metallization. Contact pads may be located at an uppermost metallization level of the wiring layer stack and may be used for connections to external devices. The source electrode structure and the gate electrode structure may comprise metal materials, such as copper, aluminum, silver, gold, tungsten, and/or alloys thereof and/or may comprise polysilicon and/or polysilicon-metal-alloys.

The source contact region 134 of the diode structure 130 may be a two-dimensional interface area (e.g. interface between semiconductor material of the diode structure and metal of the source electrode structure), at which the source electrode structure 140 (e.g., a vertical wiring element of the source electrode structure 140) is in contact with the diode structure. Furthermore, the source electrode structure may contact at least one source doping region of the semiconductor substrate 102 of the transistor arrangement.

The gate contact region 136 of the diode structure 130 may be a two-dimensional interface area (e.g. interface between semiconductor material of the diode structure and metal of the gate electrode structure), at which the gate electrode structure 142 (e.g., a vertical wiring element of the gate electrode structure 142) is in contact with the diode structure. Furthermore, the gate electrode structure may comprise at least one gate electrode used for controlling a conductive channel through a body region of the transistor arrangement.

The diode structure 130 may be a Z-diode (e.g., a Zener diode or an avalanche diode). The diode structure 130 may block a current flow in one or in two directions between its terminals (e.g., between the source contact region 134 and the gate contact region 136 of the diode structure 130). The diode structure may comprise a diode breakdown voltage of more than more than 10V (e.g. a diode breakdown voltage of 10V, 20V or 50V), more than 100V (e.g. a diode breakdown voltage of 200V, 300V, 400V or 500V), more than 500V (e.g. a diode breakdown voltage of 600V, 700V, 800V or 1000V) or more than 1000V (e.g. a diode breakdown voltage of 1200V, 1500V, 1700V, 2000V, 3300V or 6500V).

The transistor arrangement may be a field-effect transistor arrangement (e.g. a metal oxide semiconductor transistor, a double-diffused metal oxide semiconductor transistor or an insulated gate bipolar transistor), for example. The transistor arrangement may comprise a plurality of cells or repeated structures (e.g. field effect transistor cells, metal oxide semiconductor transistor cells or insulated gate bipolar transistor cells) within the cell region (or cell field). A transistor cell of the transistor arrangement may comprise at least a source region, a body region and a gate (e.g. a lateral gate at a front side surface of the semiconductor substrate or a trench gate located within a gate trench extending into the semiconductor substrate), for example. Further, the transistor cells of the plurality of transistor cells of the transistor arrangement may share a common (mutual) drift region and/or a common drain region (e.g. the transistor cells are MOSFET cells) or a common collector region (e.g. the transistor cells are IGBT cells).

For example, the transistor arrangement may comprise a breakdown voltage of more than 10V. For example, the semiconductor device 100 may be a power semiconductor device. The power semiconductor device or the transistor arrangement may have a breakdown voltage or blocking voltage of more than 10V (e.g. a breakdown voltage of 10V, 20V or 50V), more than 100V (e.g. a breakdown voltage of 200V, 300V, 400V or 500V), more than 500V (e.g. a breakdown voltage of 600V, 700V, 800V or 1000V) or more than 1000V (e.g. a breakdown voltage of 1200V, 1500V, 1700V, 2000V, 3300V or 6500V).

The semiconductor device 100 may be a compensation device (super junction device). Compensation devices may be based on mutual compensation of at least a part of the charge of n- and p-doped areas in the drift region of the transistor arrangement. For example, in a vertical transistor, p- and n-pillars or plates (plurality of drift regions and plurality of compensation regions) may be arranged in pairs. For example, a compensation region of a plurality of compensation regions comprises a laterally summed net number of dopants per unit area of the first conductivity type (p or n) deviating from half of a laterally summed net number of dopants per unit area of the second conductivity type (n or p) comprised by two drift region portions located adjacent to opposite sides of the compensation region by less than +/−25% (or less than 15%, less than +/−10%, less than +/−5%, less than 2%, or less than 1%) of the laterally summed number of dopants per unit area of the first conductivity type comprised by the compensation region. The net number of dopants per unit area of the first conductivity type may be a number of dopants of the first conductivity type minus a number of dopants of the second conductivity type in the unit area within a region of the first conductivity type and vice versa. The lateral summed net number of dopants per unit area may be substantially constant or may vary for different depths. The lateral summed net number of dopants per unit area may be equal or proportional to a number of free charge carriers within a compensation region or a drift region to be compensated in a particular depth, for example.

A region (or portion, or area) comprising the first conductivity type may be a p-doped region (or portion, or area, e.g., caused by incorporating aluminum ions or boron ions) or an n-doped region (or portion, or area, e.g., caused by incorporating antimony ions, phosphor ions or arsenic ions). Consequently, the second conductivity type indicates an opposite n-doped region (or portion, or area) or p-doped region (or portion, or area). In other words, the first conductivity type may indicate a p-doping and the second conductivity type may indicate an n-doping or vice-versa.

The semiconductor substrate 102 may be a silicon substrate. Alternatively, the semiconductor substrate 102 may be a wide band gap semiconductor substrate having a band gap larger than the band gap of silicon (1.1 eV). For example, the semiconductor substrate may be a silicon carbide (SiC)-based semiconductor substrate, or a gallium arsenide (GaAs)-based semiconductor substrate, or a gallium nitride (GaN)-based semiconductor substrate. Further, the semiconductor substrate may be a semiconductor wafer or a semiconductor die.

The surface (e.g. front side surface or main surface) of the semiconductor substrate 102 may be a semiconductor surface of the semiconductor substrate towards metal layers, insulating layers or passivation layers on top of the semiconductor surface. In comparison to a basically vertical edge (e.g. resulting from separating the semiconductor substrate from others) of the semiconductor substrate 102, the surface of the semiconductor substrate 102 may be a basically horizontal surface extending laterally. The surface of the semiconductor substrate 102 may be a basically even plane (e.g. neglecting unevenness of the semiconductor structure due to the manufacturing process or trenches). In other words, the surface of the semiconductor substrate 102 may be the interface between the semiconductor material and an insulating layer, metal layer or passivation layer (of a wiring layer stack) on top of the semiconductor substrate 102.

For example, a lateral direction or lateral expansion may be oriented basically in parallel to the front side surface or back side surface and a vertical direction or vertical expansion may be oriented basically orthogonal to the front side surface of the semiconductor substrate 102. The front side or front side surface of the semiconductor layer 102 or the semiconductor die may be the side used to implement more sophisticated and complex structures than at the backside of the semiconductor substrate 110, since the process parameters (e.g. temperature) and the handling may be limited for the backside, if structures are already formed at one side of the semiconductor substrate 110, for example.

Figure 2:
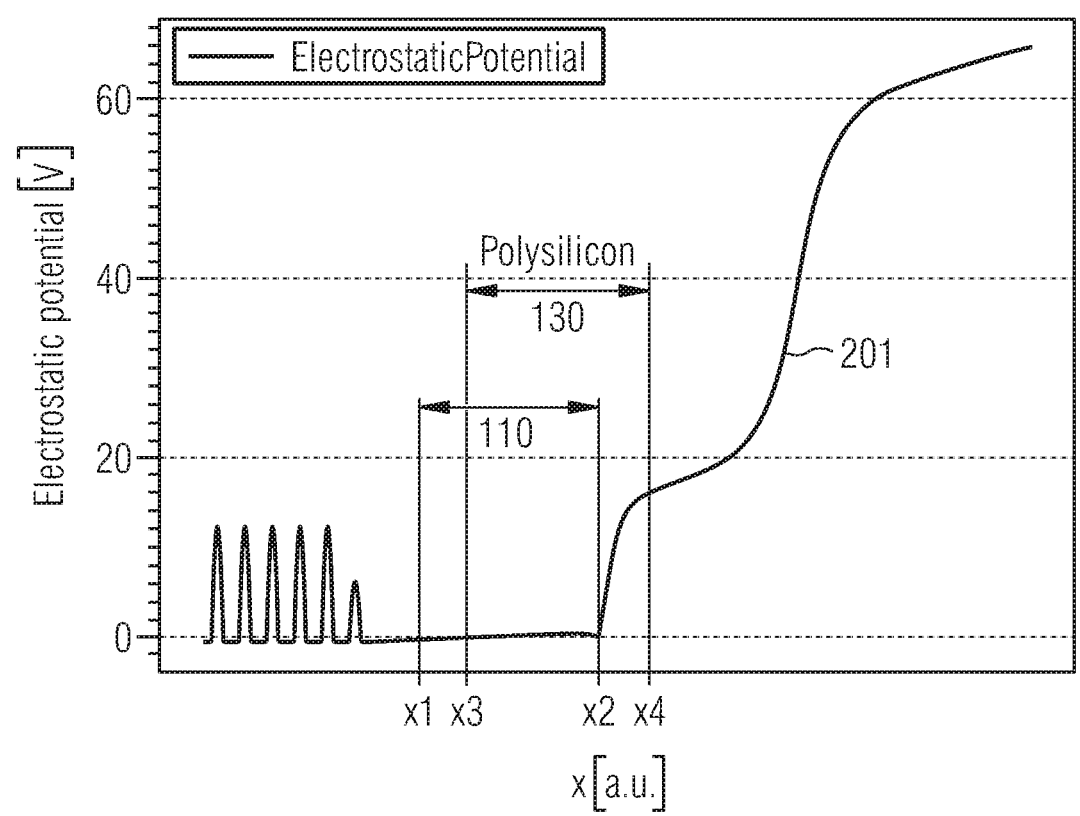
FIG. 2 shows a schematic illustration of an electrostatic potential at a front side surface of a semiconductor substrate of a semiconductor device during applying a maximal voltage to a transistor arrangement of the semiconductor device in a blocking mode of the transistor arrangement.

FIG. 2 shows a schematic illustration of an electrostatic potential 201 at a front side surface of a semiconductor substrate of a semiconductor device during applying a maximal voltage to a transistor arrangement of the semiconductor device in a blocking mode of the transistor arrangement. A gate-source voltage of the transistor arrangement is equal zero. The electrostatic potential 201 is plotted versus a lateral extension (in arbitrary units a.u.) of a part of the semiconductor substrate. In the section marked as 110 the shielding doping region 110 is located at the front side surface of the semiconductor substrate (e.g., the shielding doping region 110 extends from x=x1 to x=x2 at the front side surface of the semiconductor substrate). The lateral extension of the diode structure is marked as "Polysilicon". The diode structure extends laterally above the front side surface of the semiconductor substrate from x=x3 to x=x4 and may comprises thus a lateral overlap of several μm with the shielding doping region located at the front side surface of the semiconductor substrate. As illustrated in FIG. 2, the electrostatic potential at the front side surface of the semiconductor substrate remains at zero where the shielding doping region is located at the front side surface. A substrate pn-junction between the shielding doping region and an edge doping portion of the semiconductor substrate is located at x=x2, so that the edge doping portion is located vertically below the diode structure from x=x2 to x=x4. In this section the electrostatic potential at the front side surface of the semiconductor substrate increases, but can be maintained below approximately 16 V, so that a parasitic transistor effect within the diode structure and thus an increase in leakage current of the diode structure may be avoided.

FIG. 2 may show an example of a device simulation (lateral section at the Si surface), which provides an electric potential of 20V below the ESD diode (of which the position is indicated by "Polysilicon") in the case of an avalanche (VDS=688V, Ids=10 uA/mm2). The potential is 0V in the area of 110. Consequently, the p-shielding may—partially—be positioned under an ESD diode for achieving a high possible level of commutation strength. The face of 110 may be reduced such that the emitted minority current becomes smaller. At the same time, the 110 zone may be interrupted and may be doped at smaller rates towards the edge. Thus, dynamic electric field peaks may be reduced. This, too, might not affect the shielding of the diode.

More details and aspects are mentioned in connection with the embodiments described above or below. The embodiment shown in FIG. 2 may comprise one or more optional additional features corresponding to one or more aspects mentioned in connection with the proposed concept or one or more embodiments described above (e.g. FIG. 1) or below (e.g. FIG. 3-10).

Figure 3:
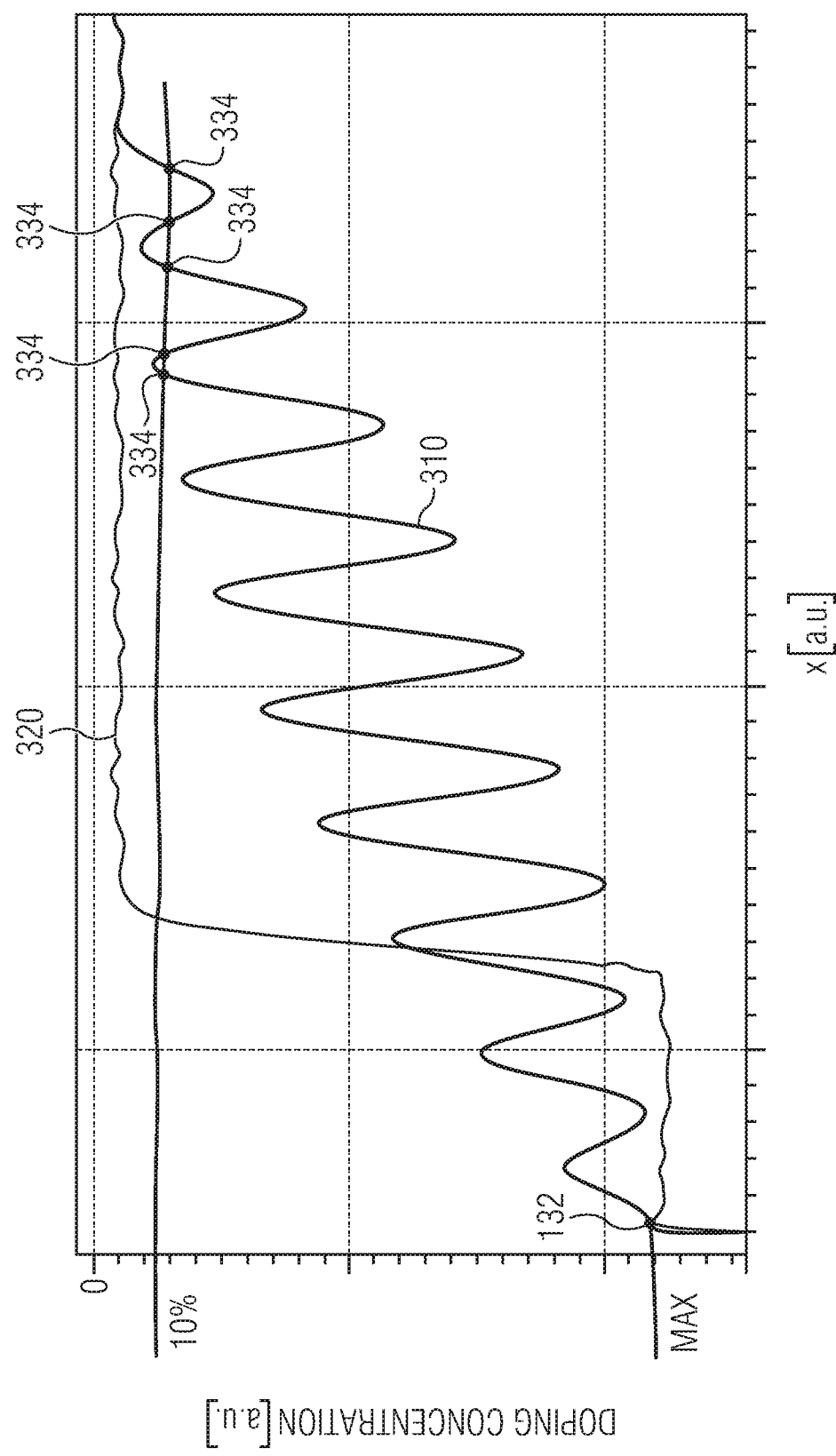
FIG. 3 shows a schematic illustration of a lateral doping profile of a non-depletable doping portion.

FIG. 3 shows an example of a doping profile 310 (doping concentration vs. lateral distance) along a lateral cut slightly below the semiconductor surface of a non-depletable doping portion of a shielding doping region 110 of semiconductor device. The doping profile comprises local maxima and minima (e.g. 8e15 cm-3 up to 1e17 cm-3, p-type) in comparison to a doping profile 320 of a non-depletable doping region with substantially constantly high doping concentration.

The doping profile 310 comprises several areas comprising the described a lower doping concentration 334 of 10% of the maximal doping concentration of the shielding doping region due to an oscillation of the doping profile over the distance. At least one of the areas with the lower doping concentration 334 may be located at a lateral distance from the substrate pn-junction 115 at the front side surface of the semiconductor substrate of less than 90% and more than 10% of a minimal lateral distance between the source contact region of the diode structure and the substrate pn-junction.

For example, FIG. 3 shows a net doping along the surface (of the semiconductor substrate). The doping profile may show a possible characteristic of a linearly graded region (e.g., the non-depletable doping portion of the shielding region). The doping may decrease linearly on average. More or less high mountains and valleys (maxima and minima) as well as a more or less high maximum concentration may remain depending on the out-diffusion.

More details and aspects are mentioned in connection with the embodiments described above or below. The embodiment shown in FIG. 3 may comprise one or more optional additional features corresponding to one or more aspects mentioned in connection with the proposed concept or one or more embodiments described above (e.g. FIGS. 1-2) or below (e.g. FIG. 4A-10).

FIG. 4A shows a schematic cross section of a part of a semiconductor device 400 comprising a field effect transistor arrangement. The semiconductor device 400 may be implemented similarly to the semiconductor device described in connection with FIG. 1. In the example of FIG. 4, the transistor arrangement is a compensation or super junction field effect transistor arrangement.

A diode structure 130 is electrically connected to a source metal pad 440 and a gate metal pad 442 of the transistor arrangement. The source metal pad 440 is part of a source electrode structure and the gate metal pad 442 is part of a gate electrode structure of the transistor arrangement. The source metal pad 440 and the gate metal pad 442 are implemented within the uppermost metallization of the wiring layer stack of the semiconductor device 400.

The diode structure 130 is contacted by a vertical wiring element of the source electrode structure extending from the source metal pad 440 to the diode structure and forming a source contact region 134 with the diode structure 130. Hence, a portion of the diode structure is located vertically below the source metal pad 440. Furthermore, the diode structure 130 is contacted by a vertical wiring element of the gate electrode structure extending from the gate metal pad 442 to the diode structure and forming a gate contact region 136 with the diode structure 130. Thus, another portion of the diode structure is located vertically below the gate metal pad 442.

The diode structure may comprise a plurality of diode doping region of the first conductivity types and a plurality of diode doping region of the second conductivity types arranged laterally in an alternating manner, so that the diode structure may comprise a plurality of diode pn-junctions. The diode structure 130 is vertically separated from a semiconductor substrate of the semiconductor device 400 by an insulating layer 104.

A non-depletable doping portion 411 (e.g., highly p-doped) of a shielding doping region 110 extends laterally at the front side surface of the semiconductor substrate from a cell region 450 of the transistor arrangement to a substrate pn-junction 115 with an edge doping portion 120 (e.g., n-doped, for example, formed by a masked implantation). The substrate pn-junction 115 is located vertically below the diode structure 130, such that it is located at the front side surface of the semiconductor substrate laterally between at least one diode pn-junction and the source contact region 134 of the diode structure 130. The non-depletable doping portion 411 (e.g. formed by a masked implantation) is electrically connected to the source metal pad 440 by a vertical wiring element of the source electrode structure.

The edge doping portion 120 extends laterally from the substrate pn-junction to (underneath) the gate contact region 136 of the diode structure 130 and further to underneath the gate metal pad 442 towards an edge of the semiconductor substrate. A first gate field plate 444 is connected via a vertical wiring element to the gate metal pad 442 and is located vertically above the edge doping portion 120. The insulating layer 104 insulates the first gate field plate 444 from the semiconductor substrate.

A buried portion (e.g., p-doped) of the shielding doping region 110 extends vertically below the edge doping portion 120. The buried portion may be a partly depletable doping portion of the shielding doping region 110 and comprises a first part 412 (e.g. depletable part, for example, formed by a masked implantation) and a second part 413 (e.g. depletable part, for example, formed by a masked implantation). The first part 412 of the buried portion extends laterally for about 40 μm from the position of the substrate pn-junction 115 (at the front side surface of the semiconductor substrate) to the second part of the buried portion. The second part 413 of the buried portion extends laterally for approximately another 40 μm from the first part 412 towards the edge of the semiconductor substrate. The first part 412 of the buried portion may comprise an incorporated doping dose at least twice an incorporated doping dose of the second part 413 of the buried portion. A plurality of edge termination compensation regions extend from the non-depletable portion 411 of the shielding region 110 as well as from the buried portion of the shielding region 110 into the semiconductor substrate.

The transistor arrangement of the semiconductor device 400 comprises a plurality of transistor cells within the cell region 450. Each transistor cell comprises a source doping region (e.g., n-doped) and a body region (e.g. p-doped) and a gate electrode 452 for controlling a channel through the body region. A drift region 454, a compensation region 456 and/or the drain region 458 (e.g. n-doped substrate) within the semiconductor substrate as well as a drain electrode (not shown in FIG. 4) may be shared by two or more or all transistor cells of the transistor arrangement. The compensation regions 456 extend from the body regions vertically into the semiconductor substrate. The source regions and the body regions of the transistor arrangement are short-circuited by the source electrode structure in contact with the source regions and the body regions at the front side surface of the semiconductor substrate. The gates 452 of the transistor arrangement are connected to the gate electrode structure. The gate electrode structure comprises a second gate field plate 460 surrounding the cell region 450 at a lowest electrically conductive layer.

For example, FIG. 4A may show an example of a cross-section through the gate pad structure of a superjunction transistor comprising an abstracted ESD diode. In the case of an avalanche with a high electric field strength distribution, the 412 and 413 zones may be depletable. FIG. 4A shows an example of a diode structure in proximity to the gate pad.

More details and aspects are mentioned in connection with the embodiments described above or below. The embodiment shown in FIG. 4A may comprise one or more optional additional features corresponding to one or more aspects mentioned in connection with the proposed concept or one or more embodiments described above (e.g. FIGS. 1-3) or below (e.g. FIG. 4B-10).

Figure 4B:
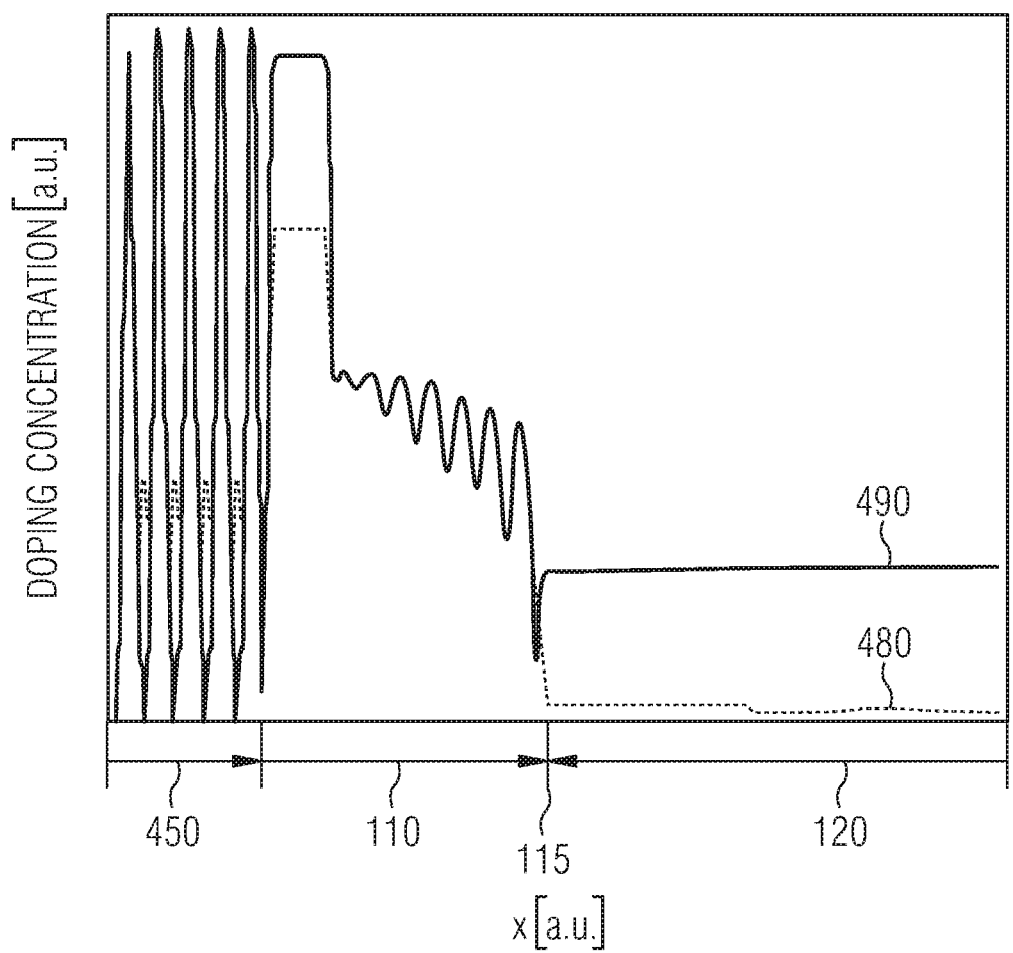
FIG. 4B shows a schematic illustration of a lateral doping profile through at least a portion of a shielding doping region and an edge doping region located at a front side surface of a semiconductor substrate of a semiconductor device.

FIG. 4B shows a schematic illustration of a lateral doping profile through at least a portion of a p-doped shielding doping region and an n-doped edge doping region located at a front side surface of a semiconductor substrate of a semiconductor device (e.g. as shown in FIG. 4A). The p-doping concentration 480 strongly varies within the cell region 450 and comprises a plurality of local maxima and minima in the shielding doping region 110 (e.g. higher doped graded region, for example, $8*10^{15}$ cm$^{-3}$ to $1*10^{17}$ cm$^{-3}$, p-type) and decreasing average doping concentration towards the substrate pn-junction between 115 the shielding doping region 110 and the edge doping region 120. At the substrate pn-junction 115, the net doping concentration 490 gets larger than the p-doping concentration 480 indicating the beginning of the n-doped edge doping region 120.

Figure 4C:
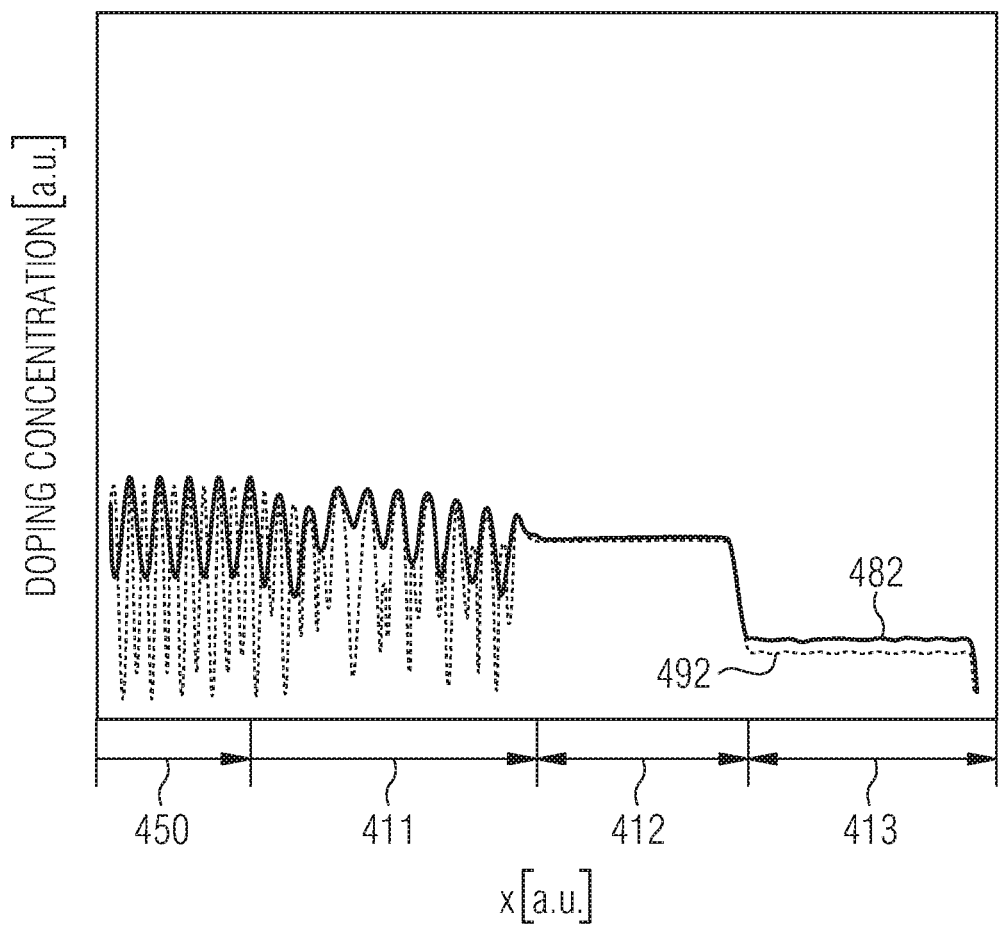
FIG. 4C shows a schematic illustration of a lateral doping profile through a buried portion of a shielding doping region of a semiconductor substrate of a semiconductor device.

FIG. 4C shows a schematic illustration of a lateral doping profile through a buried portion of a shielding doping region of a semiconductor substrate of a semiconductor device (e.g. as shown in FIG. 4A). The p-doping concentration 482 strongly varies within the cell region 450 and comprises a plurality of local maxima and minima in a non-depletable doping portion 411 of the shielding doping region and decreasing average doping concentration towards the buried portion of the shielding doping region. The buried portion of the shielding doping region comprises a depletable part 412 (e.g. peak concentration $3-4*10^{15}$ cm$^{-3}$, p-type) and a depletable part 413 (e.g. peak concentration $5-6*10^{14}$ cm$^{-3}$, p-type). The net doping concentration 492 is lower than the p-doping concentration 482 in the non-depletable doping portion 411 and the buried portion indicating a p-doping.

Figure 5:
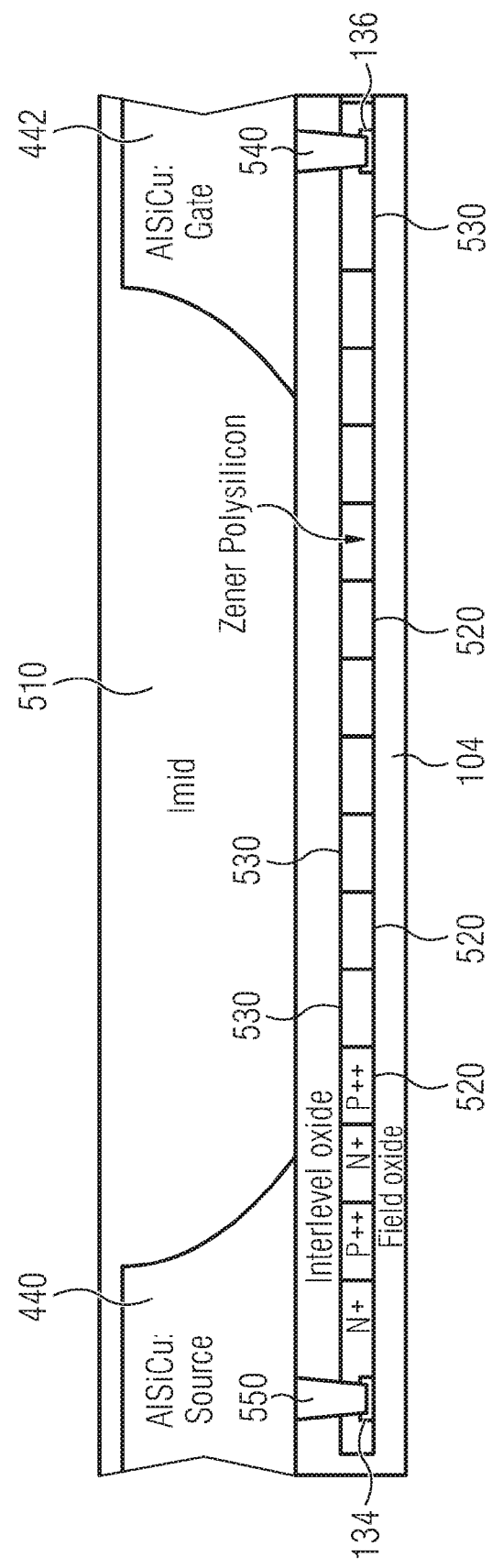
FIG. 5 shows a schematic cross section of a diode structure coupled between a source electrode structure and a gate electrode structure of a transistor arrangement of a semiconductor device.

FIG. 5 shows a schematic cross section of a diode structure coupled between a source electrode structure and a gate electrode structure of a transistor arrangement of a semiconductor device. The diode structure may be implemented in one of the semiconductor devices described above or below.

The diode structure (e.g. Zener polysilicon) comprises a plurality of very highly p-doped (p$^{++}$) regions and a plurality of highly n-doped (n$^+$) regions arranged alternatingly between a source contact area 134 and a gate contact area 136. The source pad 440 (e.g. comprising aluminum-silicon-copper AlSiCu) is connected to the diode structure through at least one via 550 at the source contact area 134. The gate pad 442 (e.g. comprising aluminum-silicon-copper AlSiCu) is connected to the diode structure through at least one via 540 at the gate contact area 136. A field oxide layer 104 is located vertically between the diode structure and the semiconductor substrate. The source pad 440 and the gate pad 442 are covered by imide 510 (e.g. except for areas used for bonding, which are not shown). The diode structure may comprise a breakdown voltage of +/-Vdb=k*Vdb0 (=k pn junctions with VDB0 each) with Vdb0 between 5V and 20V and k equal to the number of electrical blocking pn-junctions of the diode structure, for example.

More details and aspects are mentioned in connection with the embodiments described above or below. The embodiment shown in FIG. 5 may comprise one or more optional additional features corresponding to one or more aspects mentioned in connection with the proposed concept or one or more embodiments described above (e.g. FIGS. 1-4C) or below (e.g. FIG. 6-10).

Figure 6:
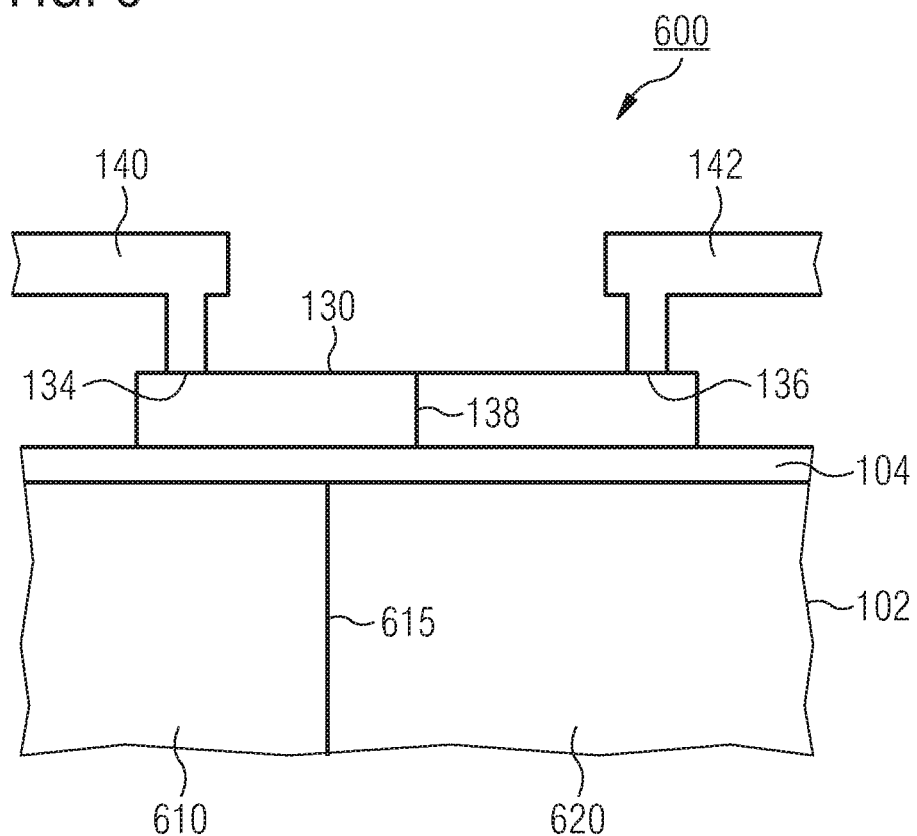
FIG. 6 shows a schematic cross section of a part of another semiconductor device.

FIG. 6 shows a schematic cross section of a part of another semiconductor device according to an embodiment. The semiconductor device 600 comprises a transistor arrangement and a diode structure 130. The diode structure 130 is coupled between a gate electrode structure 142 of the transistor arrangement and a source electrode structure 140 of the transistor arrangement. An insulating layer is located vertically between the diode structure and a front side surface of a semiconductor substrate of the semiconductor device. The diode structure 130 comprises at least one diode pn-junction 138. A depletion boundary 615 between a non-depletable doping portion 610 of a shielding doping region of the semiconductor substrate 102 and a depletable doping portion 620 of the shielding doping region extends from the front side surface of the semiconductor substrate 102 into the semiconductor substrate 102 during a blocking mode of the transistor arrangement. The non-depletable doping portion 610 comprises a doping non-depletable by voltages applied to the semiconductor device during the blocking mode. The depletable doping portion 620 comprises a doping depletable by voltages applied to the semiconductor device during the blocking mode. The depletion boundary 615 is located at the front side surface of the semiconductor substrate 102 laterally between the diode pn-junction and a source contact region 134 of the diode structure 130 with the source electrode structure 140.

The implementation of a shielding doping region with a border between a non-depletable and depletable portion that is located laterally between the diode pn-junction and the source contact region 134 may cause a similar effect as described for the substrate pn-junction in connection with FIG. 1.

For example, the non-depletable doping portion 610 may comprise an incorporated doping dose of at least $5*10^{11}$ cm$^{-2}$ (or more than $1*10^{12}$ cm$^{-2}$, or more than $2*10^{12}$ cm$^{-2}$, or more than $5*10^{12}$ cm$^{-2}$). For example, the non-depletable doping portion 610 may comprise a maximal doping concentration of at least $4*10^{15}$ cm$^{-3}$ (or at least $8*10^{15}$ cm$^{-3}$, or at least $5*10^{16}$ cm$^{-3}$, or at least $1*10^{17}$ cm$^{-3}$, for example $8*10^{15}$ to $1*10^{17}$ cm$^{-3}$).

For example, the depletable doping portion 620 may comprise an incorporated doping dose of less than $5*10^{12}$ cm$^{-2}$ (or less than $1*10^{12}$ cm$^{-2}$, or less than $5*10^{11}$ cm$^{-2}$, or less than $1*10^{11}$ cm$^{-2}$). For example, the depletable doping portion 620 may comprise a maximal doping concentration of less than $1*10^{16}$ cm$^{-3}$ (or less than $5*10^{15}$ cm$^{-3}$, or less than $1*10^{15}$ cm$^{-3}$, or less than $5*10^{14}$ cm$^{-3}$).

For example, the non-depletable doping portion may extend at least laterally from the depletion boundary at the front side surface of the semiconductor substrate to the source contact region of the diode structure. For example, the non-depletable doping portion comprises a thickness of less than 5 µm (or less than 3 µm or less than 2 µm).

More details and aspects are mentioned in connection with the embodiments described above or below. The embodiment shown in FIG. 6 may comprise one or more optional additional features corresponding to one or more aspects mentioned in connection with the proposed concept or one or more embodiments described above (e.g. FIGS. 1-5) or below (e.g. FIG. 7A-10).

Figure 7A:
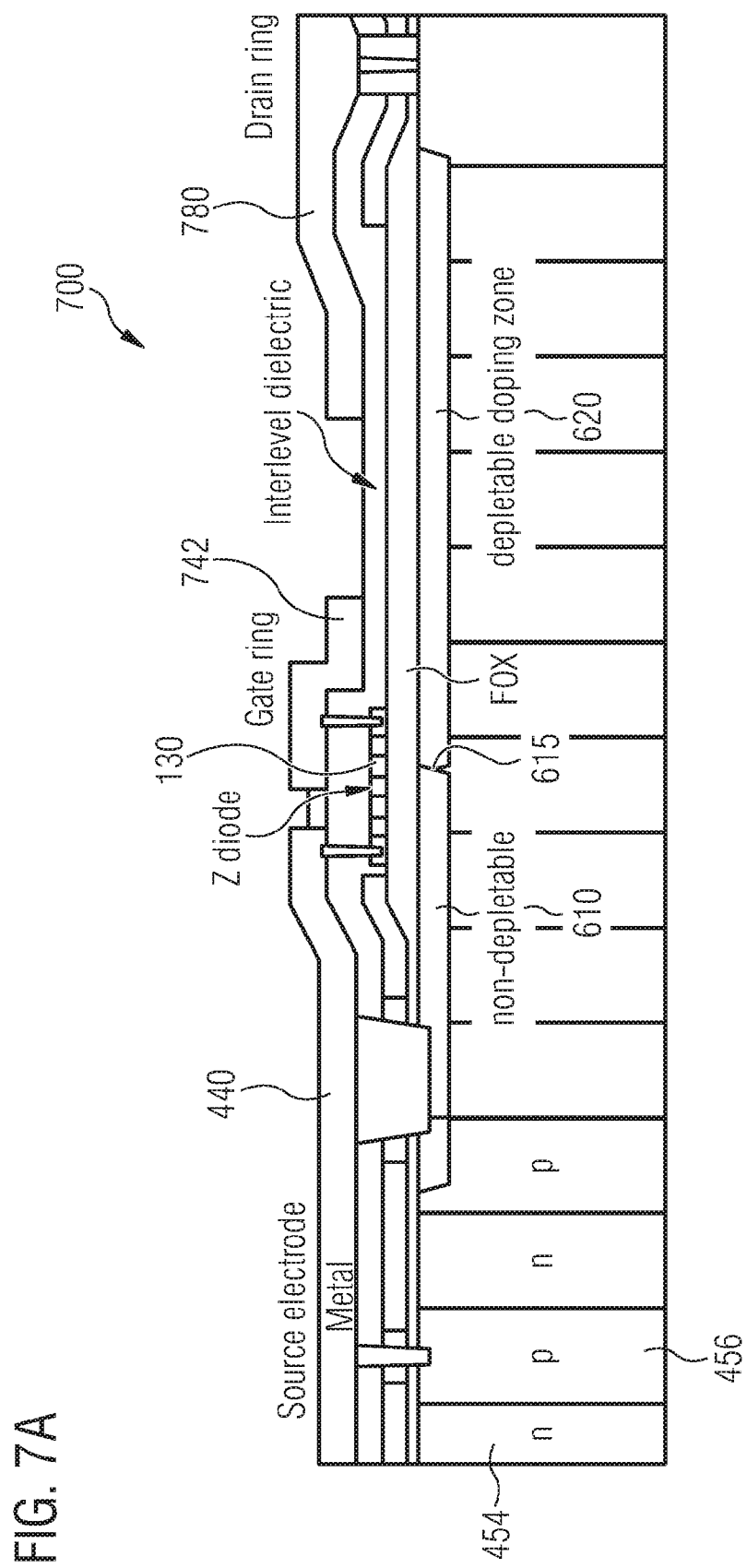
FIG. 7A shows a schematic cross section of a part of a semiconductor device comprising a field effect transistor arrangement.

FIG. 7A shows a schematic cross section of a part of a semiconductor device comprising a field effect transistor arrangement according to an embodiment. The implementation of the semiconductor device 700 is similar to the implementation shown in FIG. 4A. However, the edge doping region is replaced by a depletable doping portion 620 of the shielding doping region as described in connection with FIG. 6. Further, a part of the diode structure is located laterally between the source electrode 440 and a gate ring 742 surrounding the source metallization 440. Additionally, the semiconductor device 700 comprises a drain ring 780 laterally surrounding the gate ring 742 and extending along an edge of the semiconductor substrate. The depletable doping portion 620 of the shielding region extends laterally at the front side surface of the semiconductor substrate from the depletion border 615 to a position vertically below the drain ring 780.

FIG. 7A shows an example of a diode structure at the high voltage HV edge termination. An ESD protection in the high voltage edge termination may be implemented. The p-well may be divided in a non-depletable and a depletable zone with a transition (depletion border) between the two zones below the Z-diode. The doping concentration of the n- and p-JTE at the edge (411, 412 and 413) may be different to other high voltage edge terminations with n-type edge termination region and p-type edge termination region.

More details and aspects are mentioned in connection with the embodiments described above or below. The embodiment shown in FIG. 7A may comprise one or more optional additional features corresponding to one or more aspects mentioned in connection with the proposed concept or one or more embodiments described above (e.g. FIGS. 1-6) or below (e.g. FIG. 7B-10).

Figure 7B:
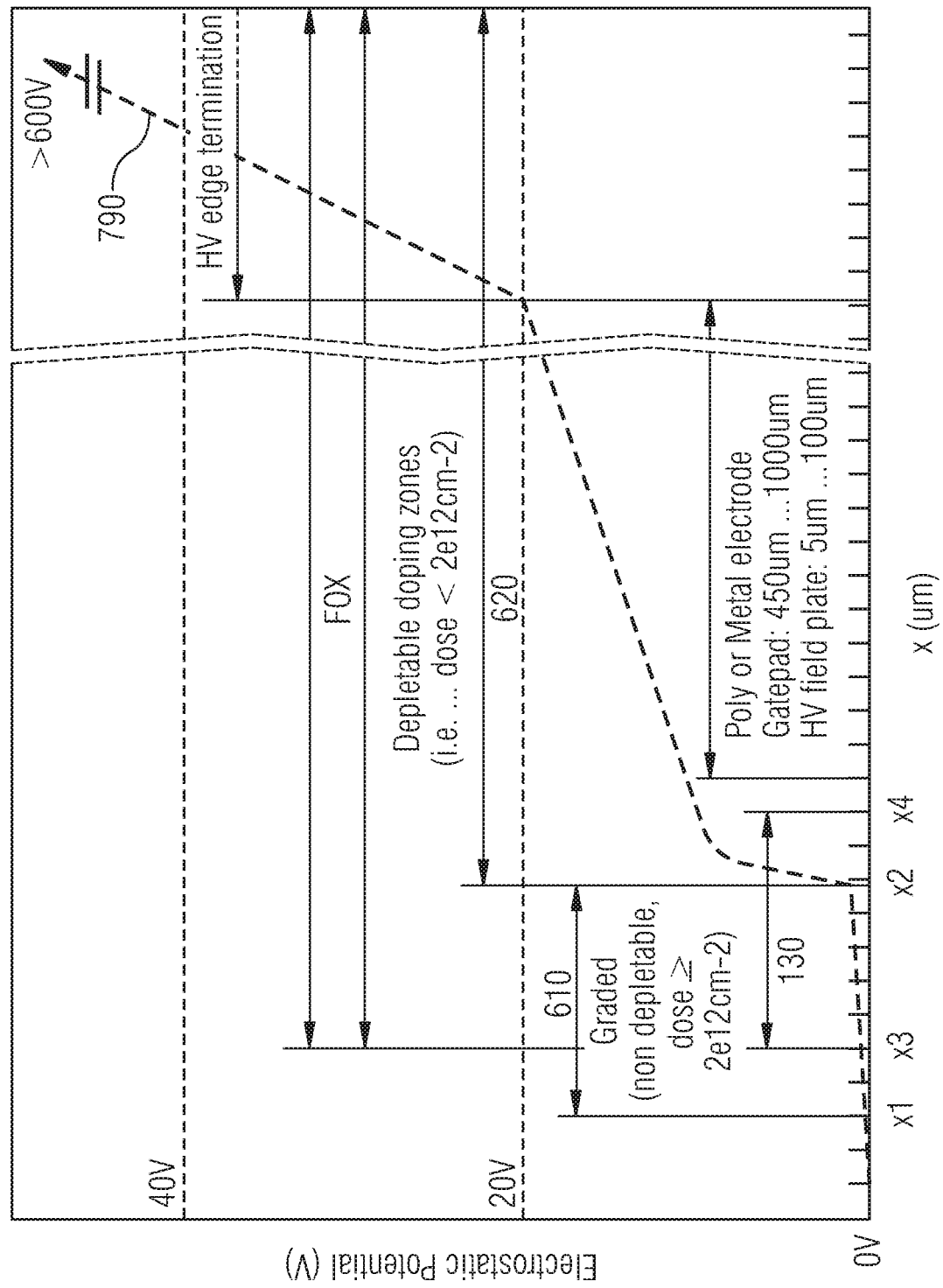
FIG. 7B shows another schematic illustration of an electrostatic potential at a front side surface of a semiconductor substrate of a semiconductor device during applying a maximal voltage to a transistor arrangement of the semiconductor device in a blocking mode of the transistor arrangement.

FIG. 7B shows a schematic illustration of an electrostatic potential 790 at a front side surface of a semiconductor substrate of a semiconductor device (e.g. the semiconductor device described in connection with FIG. 7A) during applying a maximal voltage to a transistor arrangement of the semiconductor device in a blocking mode of the transistor arrangement. A gate-source voltage of the transistor arrangement is equal zero. The electrostatic potential 790 is plotted versus a lateral extension of a part of the semiconductor substrate. In the section marked as graded doping region 610 the non-depletable portion of the shielding doping region is located at the front side surface of the semiconductor substrate (e.g. comprising a dose of equal or larger than $2*10^{12}$ cm$^{-2}$). The lateral extension of the diode structure is marked as 130. The diode structure extends laterally above the front side surface of the semiconductor substrate from x=x3 to x=x4 and comprises thus a lateral overlap of several um with the non-depletable portion of the shielding doping region located at the front side surface of the semiconductor substrate. The depletable portion of the shielding doping region (e.g. implemented by implantation) is implemented with a dose of less than $2*10^{12}$ cm$^{-2}$. The implantation of the depletable regions might not be relevant or not significantly relevant for the basic mechanism (of reducing the voltage at the surface of the semiconductor substrate below the diode structure). A poly or metal electrode of the gate pad may extend over 450 µm to 1000 µm towards the edge of the semiconductor substrate and/or a high voltage field plate may extend over 5 µm to 100 µm towards the edge of the semiconductor substrate. In the region of the high voltage HV edge termination between the lateral end of the gate pad or gate ring and/or the HV field plate and the edge of the semiconductor substrate, the voltage at the surface may increase from below 30V to the applied source-drain voltage (e.g. of more than 600V).

For example, FIG. 7B may show an example of the basic mechanism below the gate pad and the edge termination. The proposed concept may enable to keep the electrical potential below 20V in the vicinity of the ESD protection diode during D/S avalanche breakdown (e.g. Vds>680V).

More details and aspects are mentioned in connection with the embodiments described above or below. The embodiment shown in FIG. 7B may comprise one or more optional additional features corresponding to one or more aspects mentioned in connection with the proposed concept or one or more embodiments described above (e.g. FIG. 1-7A) or below (e.g. FIG. 8-10).

Figure 8:
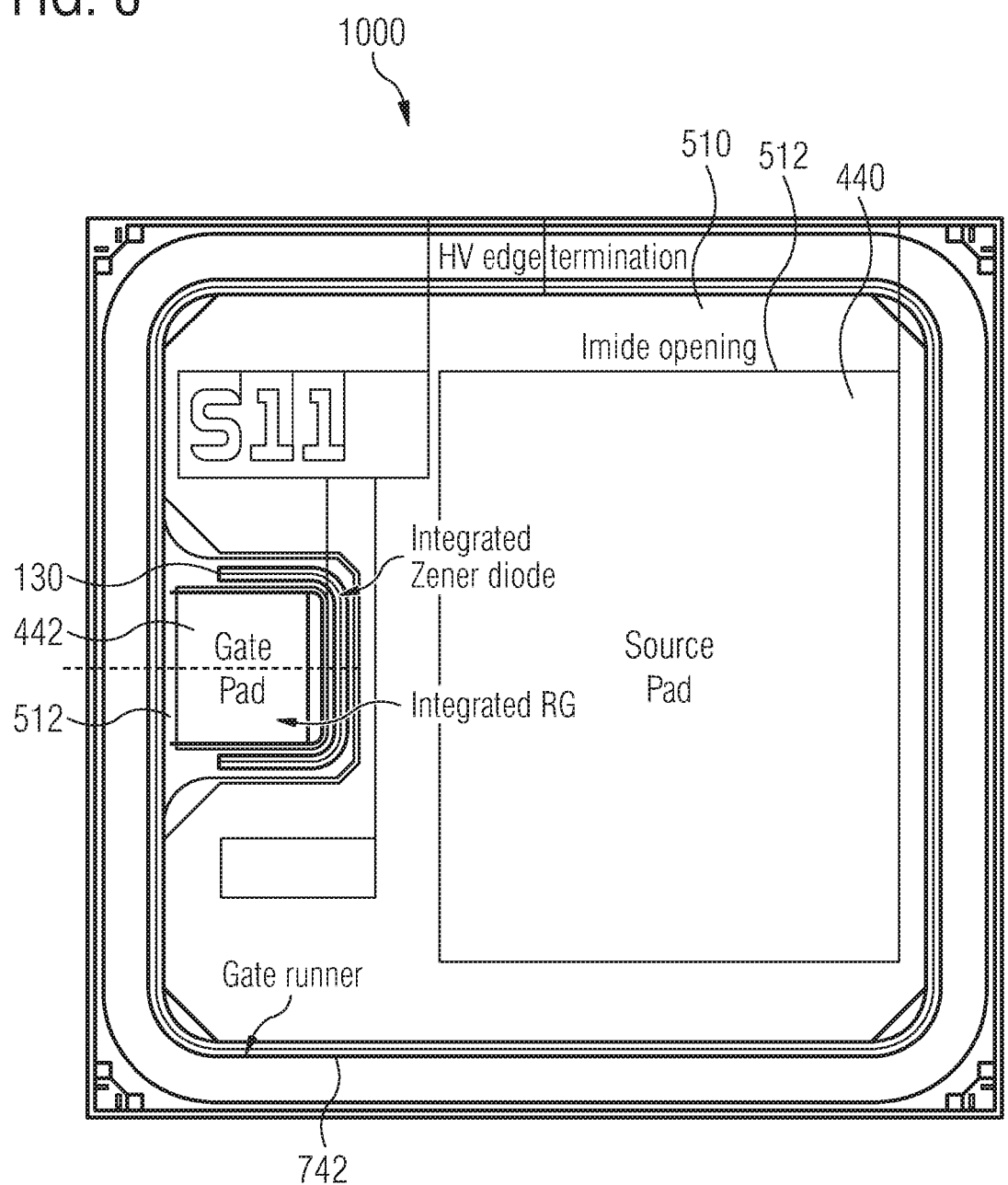
FIG. 8 shows a schematic top view of a semiconductor device comprising a diode structure together with a shielding doping region located at a gate pad of the transistor arrangement.

FIG. 8 shows a schematic top view of a semiconductor device 1000 comprising a diode structure 130 (e.g. integrated ESD protection diode) located laterally between a gate pad 442 and a source metallization of a source pad 440. A gate runner 742 is connected to the gate pad and surrounds the source metallization. The semiconductor die is covered by an imide layer 510 except for openings 512 for the gate pad and the source pad. Additionally, a gate resistor structure (integrated RG) is implemented below the gate pad. A high voltage HV edge termination extends along the edges of the semiconductor substrate.

FIG. 8 may show an overview of a power MOS chip with integrated ESD protection diode (Z-diode). The ESD diode may be integrated into a superjunction power MOSFET, e.g., in a U-shaped form in the area of the gate pad. The shielding doping region below the gate pad may comprise a high constant doping in the area of the gate pad, which, however, may only achieve very low levels of commutation strength or the shielding doping region is U-shaped in the gate pad. In case of a combination, the ESD diode does not, or does only little, overlap with the shielding doping region, for example. Thus, a high level of commutation strength may be achieved. It may be desired to avoid that the ESD diode is controlled via the drain potential. A high level of commutation strength and a sufficient shielding of the ESD diode against the drain potential at the same time may be desired.

FIG. 8 shows an example of a shielding doping region with Ω-shaped gate pad. Without the proposed shielding, the electrical potential below the pad may be up to 100V. By using the proposed shielding of the Z-diode, the potential may be below 20V below the Z-diode at the gate pad and the edge region, which may be enabled by a combination of field oxide, poly, shielding doping region and also depletable doping regions.

More details and aspects are mentioned in connection with the embodiments described above or below. The embodiment shown in FIG. 5 may comprise one or more optional additional features corresponding to one or more aspects mentioned in connection with the proposed concept or one or more embodiments described above (e.g. FIG. 1-7B) or below (e.g. FIG. 9-10).

Figure 9:
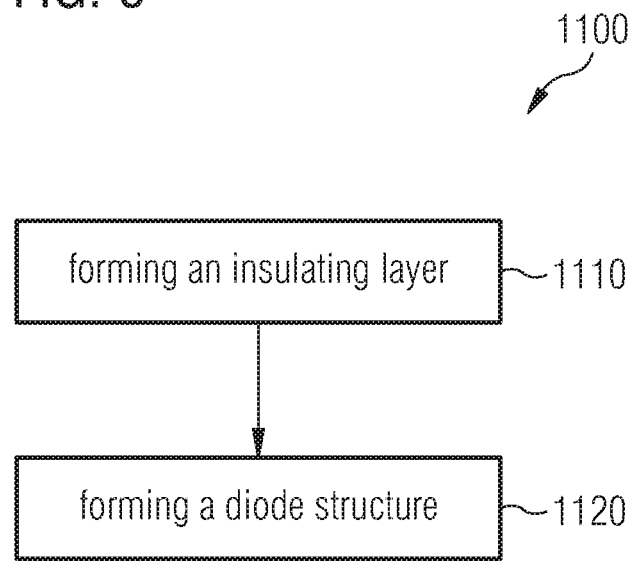
FIG. 9 shows a flow chart of a method for forming a semiconductor device.

FIG. 9 shows a flow chart of a method for forming a semiconductor device according to an embodiment. The method 1100 comprises forming 1110 an insulating layer on a front side surface of a semiconductor substrate and forming 1120 a diode structure coupled between a gate electrode structure of a transistor arrangement and a source electrode structure of the transistor arrangement. The insulating layer is located vertically between the diode structure and the front side surface of the semiconductor substrate, wherein the diode structure comprises at least one diode pn-junction. Further, a substrate pn-junction extends from the front side surface of the semiconductor substrate into the semiconductor substrate between a shielding doping region and an edge doping portion located adjacent to the shielding doping region within the semiconductor substrate. Additionally, the substrate pn-junction is located at the front side surface of the semiconductor substrate laterally between the diode pn-junction and a source contact region of the diode structure with the source electrode structure.

More details and aspects are mentioned in connection with the embodiments described above or below. The embodiment show n in FIG. 9 may comprise one or more optional additional features corresponding to one or more aspects mentioned in connection with the proposed concept or one or more embodiments described above (e.g. FIG. 1-8) or below (e.g. FIG. 10).

Figure 10:
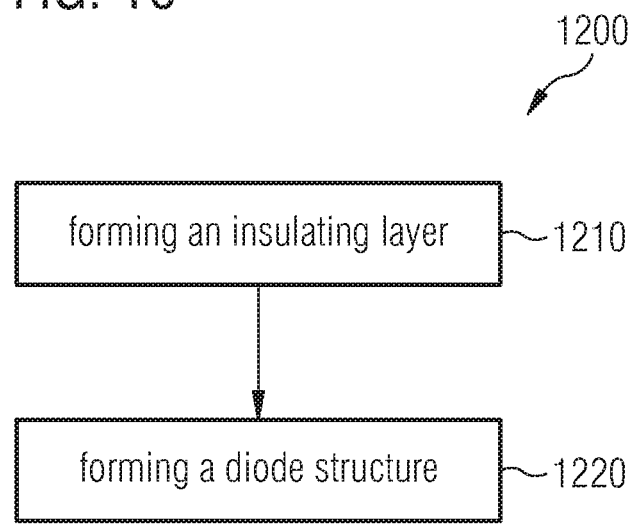
FIG. 10 shows a flow chart of another method for forming a semiconductor device.

FIG. 10 shows a flow chart of a method for forming a semiconductor device according to an embodiment. The method 1200 comprises forming 1210 an insulating layer on a front side surface of a semiconductor substrate and forming 1220 a diode structure coupled between a gate electrode structure of a transistor arrangement and a source electrode structure of the transistor arrangement. The insulating layer is located vertically between the diode structure and the front side surface of the semiconductor substrate. The diode structure comprises at least one diode pn-junction. Further, a depletion boundary between a non-depletable doping portion of a shielding doping region of the semiconductor substrate and a depletable doping portion of the shielding doping region extends from the front side surface of the semiconductor substrate into the semiconductor substrate during a blocking mode of the transistor arrangement. The non-depletable doping portion comprises a doping non-depletable by voltages applied to the semiconductor device during the blocking mode, wherein the depletable doping portion comprises a doping depletable by voltages applied to the semiconductor device during the blocking mode. Additionally, the depletion boundary is located at the front side surface of the semiconductor substrate laterally between the diode pn-junction and a source contact region of the diode structure with the source electrode structure.

More details and aspects are mentioned in connection with the embodiments described above or below. The embodiment shown in FIG. 10 may comprise one or more optional additional features corresponding to one or more aspects mentioned in connection with the proposed concept or one or more embodiments described above (e.g. FIG. 1-9) or below.

Some embodiments relate to a shielding doping region construction in superjunction power MOS for both high commutation ruggedness and full or partial backside shielding of the integrated ESD protection diode. For example, a shielding doping region below a Z-diode is proposed.

In many applications, power transistors are operated in the reverse mode (e.g. half bridge arrangements). In this connection, the body diode may be turned into the forward operation and the p-body region as well as the n-substrate (at an n-channel MOS, metal oxide semiconductor) inject electrons and holes as plasma into the drift zone. A lot of the plasma may be stored especially at the edge region due to the high volume, which is to be depleted during applying a blocking voltage (commutating). All holes from the edge region have to flow off through the outermost source/body contact, while the electrons can flow off to the provided large-area substrate, for example. Consequently, very high hole current densities and high hole concentrations may be reached at the edge region.

At super junction transistors with vertical columns, a majority of holes flows in the columns to the surface first and afterwards close to the surface towards the last cell so that up to an order of magnitude higher current densities or hole current densities occur (in comparison to a cell region hole current density). This may lead to increased charge carrier multiplication at regions of high surface field strength (e.g. below oxide steps or ramps) so that the dynamic breakdown voltage may be reduced and the device may be destroyed. The problem may be increased at chip corners or at the gate pad region, since the plasma flooded volume (per edge length) may be higher at that regions (increasing the current density or hole current density) and the electrical field may be increased due to additional curvature. Melted regions at destruction may be detected mainly at these positions.

For example, it is proposed to implement a highly doped, non-depletable, near-surface p-region (e.g. with decreasing doping towards outside) below the field oxide edge and/or the gate poly plate and optionally the gate pad, which may be implemented by an implant through several holes (within a mask layer). The holes may decrease at least partly towards the chip edge and/or the distances of the holes (between each other) may increase. The holes may form or may be strips, holes or grids.

For example, the maximal p-dose at the near-surface p-region (non-depletable doping region) within the silicon may be more than $2.5*10^{12}$ cm$^{-2}$ or more than $4*10^{12}$ cm$^{-2}$ or $7*10^{13}$ cm$^{-2}$. The implant dose may be more than $3*10^{12}$ cm$^{-2}$ or $6*10^{12}$ cm$^{-2}$ (e.g. a factor of 1 . . . 5 may be lost due to boron segregation effects). The cell may be implemented as trench cell as well, for example. The graded profile may be implemented in other ways as well (e.g. gray scale lithography and implant).

The near-surface, highly doped, graded p-region may be arranged geometrically at the whole circumference of the chip or at the critical regions only, at which a lot of plasma must be discharged (e.g. at the chip corners and/or around and/or below the gate pad), for example. The long sides may comprise no grading or another grading (e.g. smaller holes (of the implant mask) than at the outer chip corners).

Compared to the other superjunction power MOS designs, the shielding doping region 110 (implantation) under the gate pad may be removed and may be replaced by the depletable layers (implantations). At the same time, the emitter efficiency of the now strongly reduced shielding doping region face may be smaller compared to other gate pads. Thus, fewer minority charge carriers may be injected into the edge structure. The doping of depletable portions may be significantly lower than the dose of the shielding doping region (e.g. dose 413: 2e11 cm-2, dose 412: 1.1e12 cm-2, dose 411: 3e13 cm-2). The doping of the Zener diode chain may be (5e17 . . . 1e18 . . . 5e18 . . . 1e19) cm-3 in the area of the (n+) regions, and (1e19 . . . 5e20) cm-3 in the area of the (p++) regions, for example.

The combination of 411, 412, 413 may represent a graduated p-JTE (junction termination extension) with three doping concentrations decreasing towards the edge. However, the combination of field oxide FOX, poly on FOX, poly and metal field plates at the edge may have more impact.

The ESD construction described above may also be used in discretes or integrated circuits with multi-layer metallization systems.

According to an aspect, using of a partial graded p-shielding underneath the integrated ESD diode chain may be proposed for the purpose of achieving a higher level of commutation strength. The non-shielded part of the diode may have a maximum backside voltage of 20V during commutation and avalanche, and may be therefore sufficiently protected through the 20 nm . . . 1 um . . . 2 um . . . 3 um thick field oxide.

The proposed structure may be analyzed by cross section and/or Secondary ion mass spectrometry SIMS analysis of different types of atoms (e.g. boron, phosphorus, arsenic).

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A semiconductor device, comprising:
   a transistor arrangement; and
   a diode structure coupled between a gate electrode structure of the transistor arrangement and a source electrode structure of the transistor arrangement, wherein an insulating layer is located vertically between the diode structure and a front side surface of a semiconductor substrate of the semiconductor device, wherein the diode structure comprises at least one diode pn-junction,
   wherein a substrate pn-junction extends from the front side surface of the semiconductor substrate into the semiconductor substrate between a shielding doping region and an edge doping portion located adjacent to the shielding doping region within the semiconductor substrate,
   wherein the substrate pn-junction is located at the front side surface of the semiconductor substrate laterally between the diode pn-junction and a source contact region of the diode structure with the source electrode structure.

2. The semiconductor device of claim 1, wherein the shielding doping region extends at the front side surface of the semiconductor substrate laterally at least from the substrate pn-junction to the source contact region of the diode structure.

3. The semiconductor device of claim 1, wherein the diode structure comprises a first diode doping region of the first conductivity type located laterally between the diode pn-junction and the source contact region of the diode structure, and comprises a second diode doping region of the first conductivity type located laterally between the diode pn-junction and a gate contact region of the diode structure with the gate electrode structure.

4. The semiconductor device of claim 1, wherein the shielding doping region comprises a buried portion located vertically below the edge doping portion.

5. The semiconductor device of claim 4, wherein a maximal vertical extension of the edge doping portion between the front side surface of the semiconductor substrate and the buried portion of the shielding doping region is smaller than 10 μm.

6. The semiconductor device of claim 4, wherein the buried portion of the shielding doping region comprises at least a part with a doping depletable when a maximal operating voltage is applied to the transistor arrangement in a blocking mode of the transistor arrangement.

7. The semiconductor device of claim 1, wherein a common doping region of the semiconductor substrate comprises the edge doping portion and a drift region of the transistor arrangement.

8. The semiconductor device of claim 1, wherein the shielding doping region comprises a non-depletable doping portion which is non-depletable by voltages applied to the transistor arrangement during a blocking mode of the transistor arrangement, wherein the non-depletable doping portion extends laterally at the front side surface of the semiconductor substrate from a cell region of the transistor arrangement to a distance to the substrate pn-junction of less than 500 nm.

9. A semiconductor device, comprising:
a transistor arrangement; and
a diode structure coupled between a gate electrode structure of the transistor arrangement and a source electrode structure of the transistor arrangement, wherein an insulating layer is located vertically between the diode structure and a front side surface of a semiconductor substrate of the semiconductor device, wherein the diode structure comprises at least one diode pn-junction,
wherein a depletion boundary between a non-depletable doping portion of a shielding doping region of the semiconductor substrate and a depletable doping portion of the shielding doping region extends from the front side surface of the semiconductor substrate into the semiconductor substrate during a blocking mode of the transistor arrangement, wherein the non-depletable doping portion is non-depletable by voltages applied to the semiconductor device during the blocking mode, wherein the depletable doping portion is depletable by voltages applied to the semiconductor device during the blocking mode,
wherein the depletion boundary is located at the front side surface of the semiconductor substrate laterally between the diode pn-junction and a source contact region of the diode structure with the source electrode structure.

10. The semiconductor device of claim 9, wherein the non-depletable doping portion extends at least laterally from the depletion boundary at the front side surface of the semiconductor substrate to the source contact region of the diode structure.

11. The semiconductor device of claim 1, wherein the shielding doping region is electrically connected to the source electrode structure.

12. The semiconductor device of claim 1, wherein the shielding doping region comprises the same conductivity type as a body region of the transistor arrangement.

13. The semiconductor device of claim 1, wherein the substrate pn-junction or the depletion boundary is located at the front side surface of the semiconductor substrate at a position laterally between the diode pn-junction and the source contact region of the diode structure, so that, during applying a maximal operating voltage in a blocking mode of the transistor arrangement, an absolute value of a voltage between the diode structure and any point at the front side surface of the semiconductor substrate located laterally between the source contact region of the diode structure and a gate contact region of the diode structure is smaller than an absolute value of a threshold voltage of a parasitic transistor structure, wherein the parasitic transistor structure comprises at least one n-p-n-doping portions sequence of the diode structure or at least one p-n-p doping portions sequence of the diode structure.

14. The semiconductor device of claim 1, wherein the substrate pn-junction or the depletion boundary is located at the front side surface of the semiconductor substrate at a position laterally between the diode pn-junction and the source contact region of the diode structure, so that, during applying a maximal operating voltage in a blocking mode of the transistor arrangement, an absolute value of a voltage between the diode structure and any point at the front side surface of the semiconductor substrate located laterally between the source contact region of the diode structure and a gate contact region of the diode structure is smaller than 30 V.

15. The semiconductor device of claim 1, wherein the shielding doping region comprises a position of a maximal doping region located laterally closer to the source contact region of the diode structure than to the substrate pn-junction, wherein the shielding doping region comprises a lateral profile of the doping concentration of the shielding doping region comprising a plurality of local maxima and local minima laterally between the substrate pn-junction or the depletion boundary and a cell region of the transistor arrangement, wherein neighboring local maxima and local minima of the plurality of local maxima and local minima differ by more than 10% of the maximal doping concentration.

16. The semiconductor device of claim 1, wherein at least a portion of the diode structure is located laterally between an uppermost metallization of the source electrode structure and an uppermost metallization of the gate electrode structure.

17. The semiconductor device of claim 1, wherein the shielding doping region extends laterally at least from the source contact region of the diode structure to a gate runner of the transistor arrangement or to a gate pad of the transistor arrangement.

18. The semiconductor device of claim 1, wherein a thickness of the insulating layer is larger than 500 nm.

19. The semiconductor device of claim 1, wherein the semiconductor device comprises a breakdown voltage larger than 10 V.

20. A method for forming a semiconductor device, the method comprising:
forming an insulating layer on a front side surface of a semiconductor substrate; and
forming a diode structure coupled between a gate electrode structure of a transistor arrangement and a source electrode structure of the transistor arrangement, the insulating layer being located vertically between the diode structure and the front side surface of the semiconductor substrate, the diode structure comprising at least one diode pn-junction,
wherein a substrate pn-junction extends from the front side surface of the semiconductor substrate into the semiconductor substrate between a shielding doping region and an edge doping portion located adjacent to the shielding doping region within the semiconductor substrate,
wherein the substrate pn-junction is located at the front side surface of the semiconductor substrate laterally between the diode pn-junction and a source contact region of the diode structure with the source electrode structure.

\* \* \* \* \*